(12) United States Patent
Kwak

(10) Patent No.: US 11,594,286 B2
(45) Date of Patent: Feb. 28, 2023

(54) NON-VOLATILE MEMORY DEVICE AND METHOD OF OPERATING THE SAME

(71) Applicant: SAMSUNG ELECTRONICS CO., LTD., Suwon-si (KR)

(72) Inventor: Dong-Hun Kwak, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/665,049

(22) Filed: Feb. 4, 2022

(65) Prior Publication Data

US 2022/0157388 A1 May 19, 2022

Related U.S. Application Data

(63) Continuation of application No. 16/935,559, filed on Jul. 22, 2020, now Pat. No. 11,276,472, which is a
(Continued)

(51) Int. Cl.
*G11C 16/04* (2006.01)
*G11C 16/26* (2006.01)
(Continued)

(52) U.S. Cl.
CPC .......... *G11C 16/26* (2013.01); *G11C 16/0483* (2013.01); *G11C 16/08* (2013.01); *G11C 16/10* (2013.01); *G11C 16/3459* (2013.01); *H01L 24/05* (2013.01); *H01L 24/08* (2013.01); *H01L 25/0657* (2013.01); *H01L 25/18* (2013.01); *H01L 27/11556* (2013.01); *H01L 27/11582* (2013.01); *H01L 2224/05147* (2013.01); *H01L 2224/08145* (2013.01); *H01L 2924/1431* (2013.01); *H01L 2924/14511* (2013.01)

(58) Field of Classification Search
CPC .. G11C 16/26; G11C 16/3459; G11C 16/3445
See application file for complete search history.

(56) References Cited

U.S. PATENT DOCUMENTS 9,183,939 B2 11/2015 Nam et al.
9,633,740 B1 4/2017 Alhussien et al.
(Continued)

FOREIGN PATENT DOCUMENTS

KR  1020150001400  1/2015

OTHER PUBLICATIONS

Korean Office Action dated Dec. 10, 2022 Cited in Corresponding Korean Patent Application No. 10-2018-0160352.

*Primary Examiner* — Mohammed A Bashar
(74) *Attorney, Agent, or Firm* — Volentine, Whitt & Francos, PLLC

(57) ABSTRACT

A method of operating a non-volatile memory device includes performing a first sensing operation on the non-volatile memory device during a first sensing time including a first section, a second section, and a third section. The performing of the first sensing operation includes applying a first voltage level, which is variable according to a first target voltage level, to a selected word line in the first section, applying a second voltage level, which is different from the first voltage level, to the selected word line in the second section, and applying the first target voltage level, which is different from the second voltage level, to the selected word line in the third section. The first voltage level becomes greater as the first target voltage level becomes greater.

20 Claims, 21 Drawing Sheets

Related U.S. Application Data continuation-in-part of application No. 16/547,416, filed on Aug. 21, 2019, now Pat. No. 11,217,314.

(51) Int. Cl.

| | | |
|---|---|---|
| *G11C 16/08* | (2006.01) | |
| *G11C 16/10* | (2006.01) | |
| *G11C 16/34* | (2006.01) | |
| *H01L 25/065* | (2023.01) | |
| *H01L 25/18* | (2023.01) | |
| *H01L 23/00* | (2006.01) | |
| *H01L 27/11556* | (2017.01) | |
| *H01L 27/11582* | (2017.01) | |

(56) References Cited

U.S. PATENT DOCUMENTS

| | | |
|---|---|---|
| 9,779,790 B2 | 10/2017 | Park et al. |
| 9,805,808 B2 | 10/2017 | Shimura |
| 2015/0221351 A1 | 8/2015 | Park et al. |
| 2016/0035417 A1 | 2/2016 | Park et al. |
| 2016/0307638 A1 | 10/2016 | Shirakawa et al. |
| 2017/0243654 A1 | 8/2017 | Abe et al. |
| 2018/0046527 A1 | 2/2018 | Reusswig et al. |
| 2018/0203762 A1 | 7/2018 | Alrod et al. |
| 2019/0096479 A1 | 3/2019 | Yu et al. |
| 2019/0221557 A1 | 7/2019 | Kim et al. |

NON-VOLATILE MEMORY DEVICE AND METHOD OF OPERATING THE SAME

CROSS-REFERENCE TO RELATED APPLICATION

This application is a continuation of U.S. application Ser. No. 16/935,559, filed Jul. 22, 2020, which is a continuation-in-part of U.S. application Ser. No. 16/547,416, filed Aug. 21, 2019, now U.S. Pat. No. 11,217,314, and a claim of priority is made to Korean Patent Application No. 10-2018-0160352, filed on Dec. 12, 2018, in the Korean Intellectual Property Office, the disclosure of each of which is incorporated herein in its entirety by reference.

BACKGROUND

The inventive concept relates to a memory, and more particularly, to a non-volatile memory device and a method of operating the same.

Memory devices are used to store data and may be classified as either volatile memory devices or non-volatile memory devices. A flash memory device, which is an example of a non-volatile memory device, may be employed in portable phones, digital cameras, personal digital assistants (PDAs), transportable computer devices, fixed computer devices, and other devices. Recently, as information communication devices have become more multifunctional, it has become more necessary to increase the capacity and integration density of memory devices.

SUMMARY

The inventive concept provides a non-volatile memory device, which may reduce a word line setup time and improve sensing performance, and a method of operating the device.

According to an aspect of the inventive concept, there is provided a method of operating a non-volatile memory device. The method includes performing a first sensing operation on the non-volatile memory device during a first sensing time including a first section, a second section, and a third section. The performing of the first sensing operation includes applying a first voltage level, which is variable according to a first target voltage level, to a selected word line in the first section, applying a second voltage level, which is different from the first voltage level, to the selected word line in the second section, and applying the first target voltage level, which is different from the second voltage level, to the selected word line in the third section. The first voltage level becomes greater as the first target voltage level becomes greater.

According to another aspect of the inventive concept, there is provided a method of operating a non-volatile memory device. The method includes performing a first sensing operation on the non-volatile memory device during a first sensing time including a first section, a second section, and a third section. The performing of the first sensing operation includes applying a first voltage level to a selected word line in the first section, a duration of which is variable according to a first target voltage level, applying a second voltage level, which is different from the first voltage level, to the selected word line in the second section, and applying the first target voltage level, which is different from the second voltage level, to the selected word line in the third section. A duration of the first section becomes longer as the first target voltage level becomes greater.

According to another aspect of the inventive concept, there is provided a method of operating a non-volatile memory device. The method includes performing a first sensing operation on the non-volatile memory device during a first sensing time, and performing a second sensing operation on the non-volatile memory device during a second sensing time after the first sensing time. The performing of the first sensing operation includes applying a first voltage level to a selected word line in a first section of the first sensing time, applying a second voltage level to the selected word line in a second section of the first sensing time, which follows the first section of the first sensing time, wherein the second voltage level is different from the first voltage level, and applying a first target voltage level to the selected word line in a third section of the first sensing time, which follows the second section of the first sensing time, wherein the first target voltage level is different from the second voltage level. As the first target voltage level becomes greater, a duration of the first section becomes longer or the first voltage level becomes greater.

According to another aspect of the inventive concept, there is provided a non-volatile memory device including a memory cell array including a memory cell and a selected word line connected to the memory cell, a control logic circuit configured to divide a sensing time for which a sensing operation is performed on the memory cell, into a first section, a second section, and a third section, determine a selected word line voltage applied to the selected word line to be a first voltage level in the first section, determine the selected word line voltage to be a second voltage level in the second section, determine the selected word line voltage to be a target voltage level in the third section, and determine at least one of a duration of the first section and the first voltage level according to the target voltage level, wherein the second voltage level is different from the first voltage level, and the target voltage level is different from the second voltage level, and a voltage generator configured to generate the second word line voltage in the first to third sections.

According to yet another aspect of the inventive concept, there is provided a non-volatile memory device including a memory cell array comprising a plurality of word lines and memory cells each connected to one of the word lines; a control logic circuit; and a voltage generator. The control logic circuit is configured to select a selected word line among the plurality of word lines in response to an address received by the control logic circuit, to determine a target voltage level to be applied to the selected word line as a selected word line voltage for a sensing operation during a first sensing time in order to perform a memory operation on a selected memory cell connected to the selected word line, the control logic circuit further configured to: cause the selected word line voltage to be a first voltage level in a first section of the first sensing time, cause the selected word line voltage to be a second voltage level in a second section of the first sensing time which immediately follows the first section of the first sensing time, wherein the second voltage is different than the first voltage level, and cause the selected word line voltage to be the target voltage level in a third section of the first sensing time which immediately follows the second section of the first sensing time, wherein the target voltage level is different than the second voltage level. The voltage generator is configured to generate the selected word line voltage in the first, second, and third sections of the sensing time in response to the control logic circuit.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

The inventive concept will now be described more fully hereinafter with reference to the accompanying drawings, in which embodiments are shown.

Figure 1:
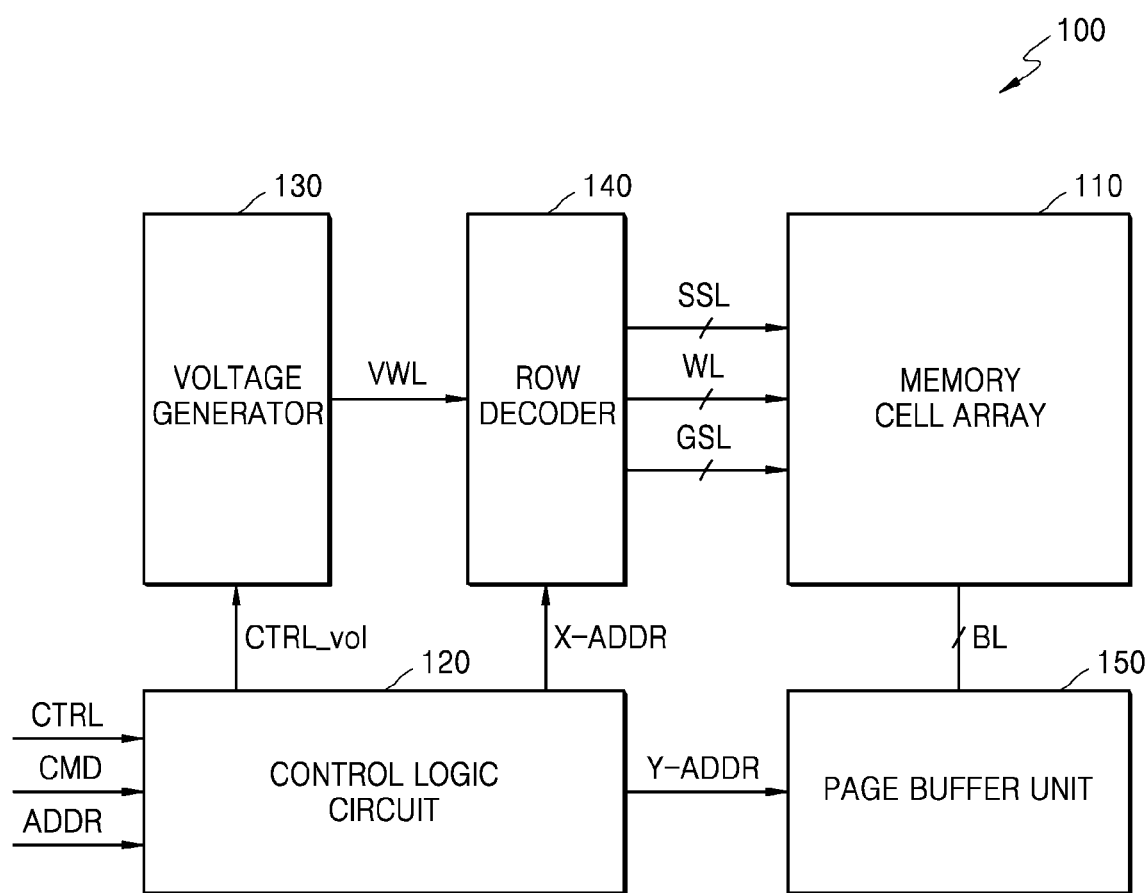
FIG. 1 is a block diagram of an embodiment of a non-volatile memory device.

FIG. 1 is a block diagram of an embodiment of a non-volatile memory device 100.

Referring to FIG. 1, non-volatile memory device 100 may include a memory cell array 110, a control logic circuit 120, a voltage generator 130, a row decoder 140, and a page buffer unit 150. Although not shown in FIG. 1, non-volatile memory device 100 may further include a data input/output (I/O) circuit or an I/O interface. Also, non-volatile memory device 100 may further include a column logic circuit, a voltage generator, a pre-decoder, a temperature sensor, a command decoder, and an address decoder. Here, each of the control logic circuit 120 and column logic circuit may be implemented by discrete logic elements, by an application specific integrated circuit (ASIC), by a combination of a memory that stores instructions and a processor that executes the instructions, or by any combination of these devices.

Memory cell array 110 may be connected to page buffer unit 150 through bit lines BL and connected to row decoder 140 through word lines WL, string selection lines SSL, and ground selection lines GSL. Memory cell array 110 may include a plurality of memory cells. For example, the memory cells may be flash memory cells. Hereinafter, an example in which the plurality of memory cells are NAND flash memory cells will be described in detail with reference to embodiments. However, embodiments are not limited thereto. In some embodiments, the plurality of memory cells may be resistive memory cells, such as resistive random access memory (ReRAM) cells, phase-change RAM (PRAM) cells, or magnetic RAM (MRAM) cells.

In an embodiment, memory cell array 110 may include a three-dimensional (3D) memory cell array. The 3D memory cell array may include a plurality of NAND strings, each of which may include memory cells connected respectively to word lines that are vertically stacked on a substrate, as described in detail below with reference to FIGS. 2 to 4. The following patent documents, which are hereby incorporated by reference, disclose suitable configurations for 3D memory arrays, in which the 3D memory array is configured at a plurality of levels, with word lines and/or bit lines shared between levels: U.S. Pat. Nos. 7,679,133; 8,553,466; 8,654,587; 8,559,235; and U.S. Pat. Pub. No. 2011/0233648. However, embodiments are not limited thereto. In some embodiments, memory cell array 110 may include a two-dimensional (2D) memory cell array, which may include a plurality of NAND strings arranged in a row direction and a column direction.

Figure 2:
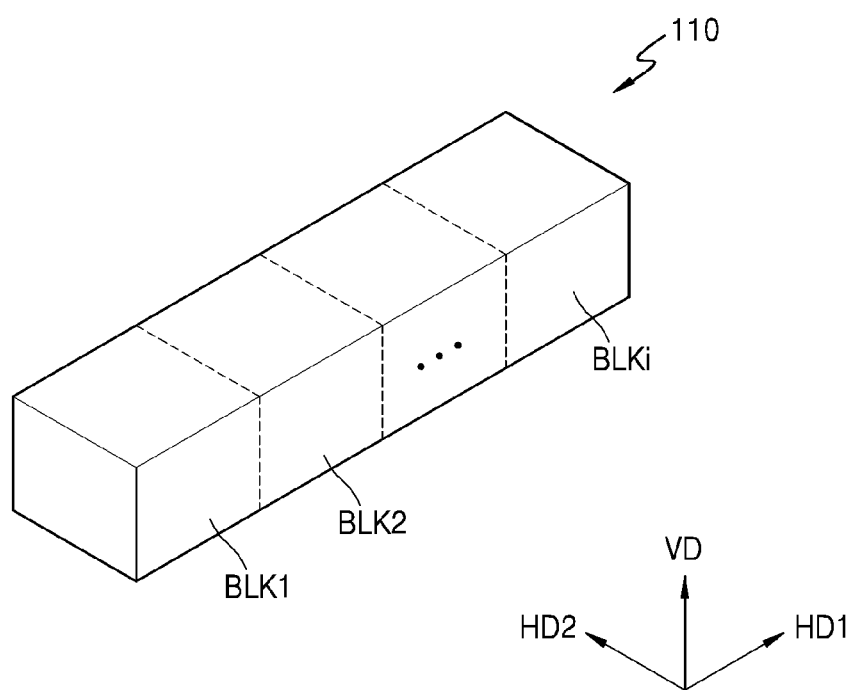
FIG. 2 is a diagram of an embodiment of a memory cell array.

FIG. 2 is a diagram of an embodiment of a memory cell array 110.

Referring to FIG. 2, memory cell array 110 may include a plurality of memory blocks BLK1 to BLKi, and i may be a positive integer. Each of the plurality of memory blocks BLK1 to BLKi may have a three-dimensional (3D) structure (or a vertical structure). Specifically, each of the plurality of memory blocks BLK1 to BLKi may include a plurality of NAND strings extending in a vertical direction VD. In this case, the plurality of NAND strings may be provided a predetermined distance apart from each other in first and second horizontal directions HD1 and HD2. The plurality of memory blocks BLK1 to BLKi may be selected by row decoder 140. For example, row decoder 140 may select a memory block, among the memory blocks BLK1 to BLKi, corresponding to a block address.

Figure 3:
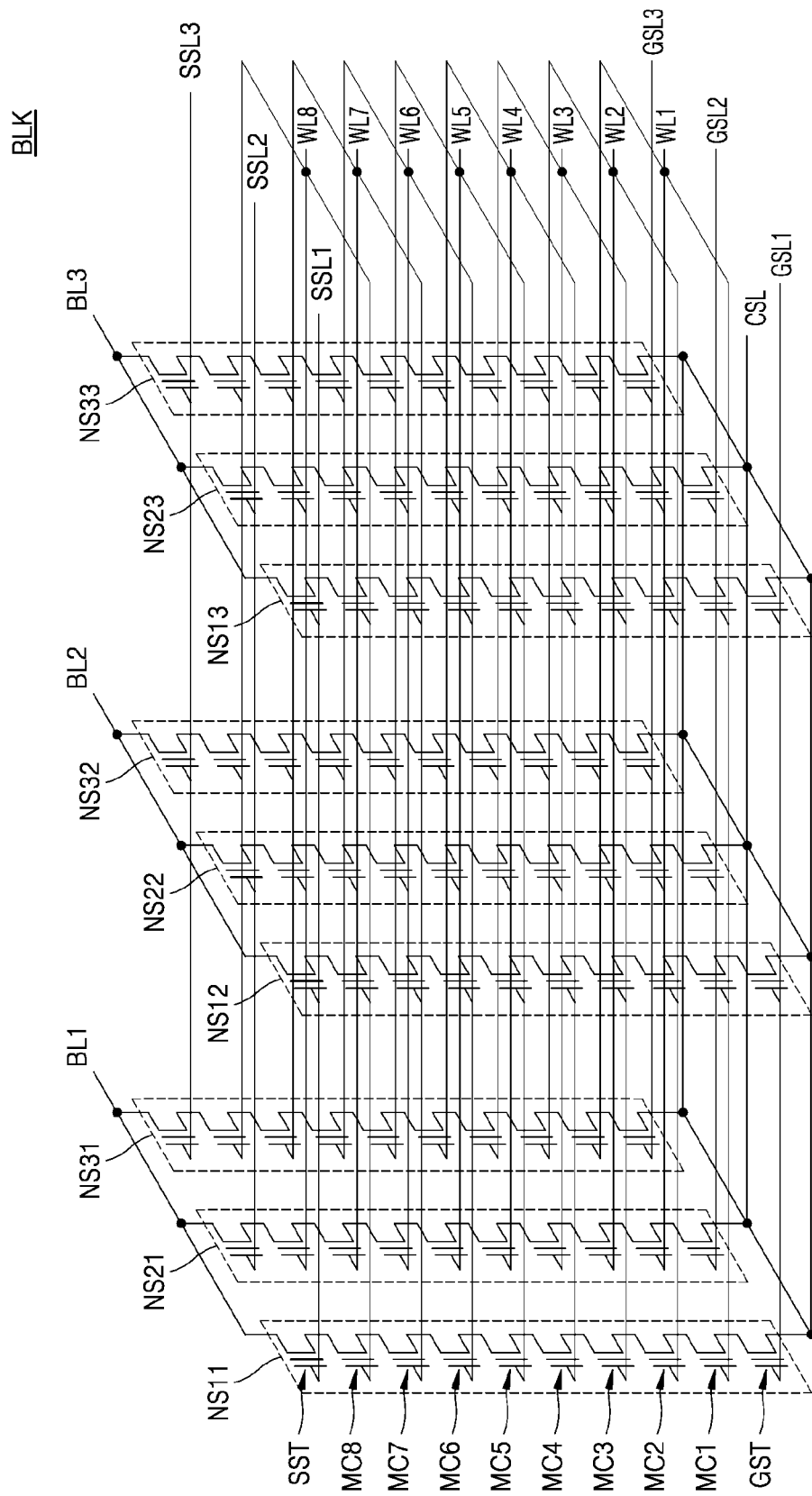
FIG. 3 is an equivalent circuit diagram of an embodiment of a memory block.

FIG. 3 is an equivalent circuit diagram of an embodiment of a memory block BLK. For example, the memory block BLK may correspond to one of the plurality of memory blocks BLK1 to BLKi of FIG. 2.

Referring to FIG. 3, the memory block BLK may include a plurality of NAND strings (e.g., NS11 to NS33), a plurality of word lines (e.g., WL1 to WL8), a plurality of bit lines (e.g., BL1 to BL3), a plurality of ground selection lines (e.g., GSL1 to GSL3), a plurality of string selection lines (e.g., SSL1 to SSL3), and a common source line CSL. Here, the number of NAND strings, the number of word lines, the number of bit lines, the number of ground selection lines, and the number of string selection lines may be variously changed according to an embodiment.

NAND strings NS11, NS21, and NS31 may be provided between a first bit line BL1 and the common source line CSL, NAND strings NS12, NS22, and NS32 may be provided between a second bit line BL2 and the common source line CSL, and NAND strings NS13, NS23, and NS33 may be provided between the third bit line BL3 and the common source line CSL. Each NAND string (e.g., NS11) may include a string selection transistor SST, a plurality of memory cells MC1 to MC8, and a ground selection transistor GST, which may be connected in series.

The string selection transistor SST may be connected to the string selection lines SSL1 to SSL3 corresponding thereto. The memory cells MC1 to MC8 may be connected to the word lines WL1 to WL8 respectively corresponding thereto. The ground selection transistor GST may be connected to the ground selection lines GSL1 to GSL3 corresponding thereto. The string selection transistor SST may be connected to the bit lines BL1 to BL3 corresponding thereto, and the ground selection transistor GST may be connected to the common source line CSL.

In the present embodiment, word lines (e.g., WL1) located at the same level may be connected in common to one another, the string selection lines SSL1 to SSL3 may be separated from one another, and the ground selection lines GSL1 to GSL3 may be separated from one another. Although FIG. 3 illustrates an example in which word lines located at the same level are shared among the three string selection lines SSL1 to SSL3, embodiments are not limited thereto. In an example, word lines located at the same level may be shared between two string selection lines. In another example, word lines located at the same level may be shared among four string selection lines.

Although FIG. 3 illustrates a case in which each of the plurality of NAND strings NS11 to NS33 includes one string selection transistor SST and one ground selection transistor GST, embodiments are not limited thereto. In an embodiment, each of the plurality of NAND strings NS11 to NS33 may include a plurality of string selection transistors and one ground selection transistor GST. In this case, the memory block BLK may further include a plurality of string selection lines stacked in the vertical direction VD. In an embodiment, each of the plurality of NAND strings NS11 to NS33 may include one string selection transistor SST and a plurality of ground selection transistors. In this case, the memory block BLK may further include a plurality of ground selection lines stacked in the vertical direction VD. In an embodiment, each of the plurality of NAND strings NS11 to NS33 may include a plurality of string selection transistors and a plurality of ground selection transistors. In this case, the memory block BLK may further include a plurality of string selection lines stacked in the vertical direction VD and a plurality of ground selection lines stacked in the vertical direction VD.

Figure 4:
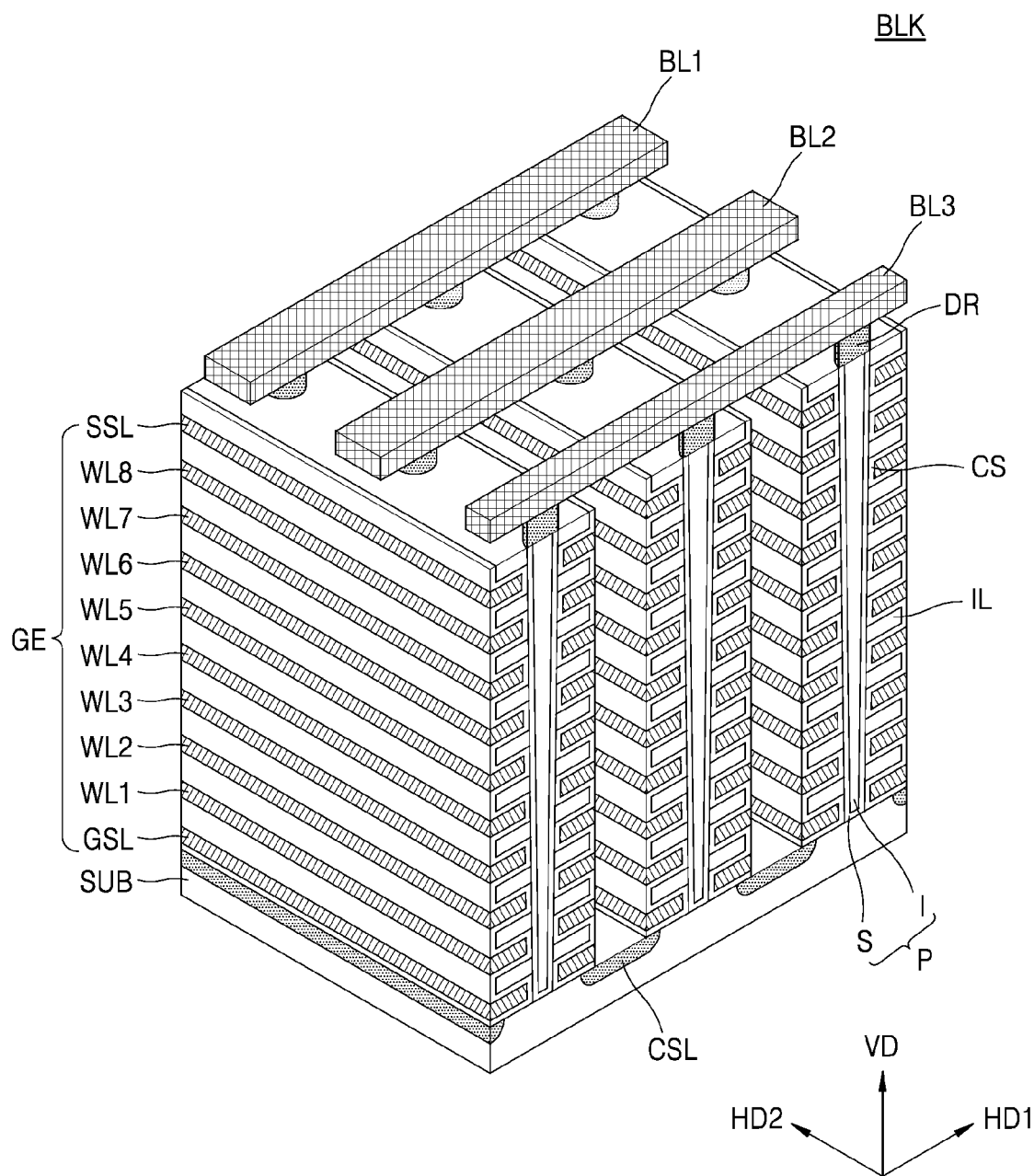
FIG. 4 is a perspective view of the memory block of FIG. 3, according to an embodiment.

FIG. 4 is a perspective view of the memory block BLK of FIG. 3, according to an embodiment.

Referring to FIG. 4, the memory block BLK may be formed in a perpendicular direction to a substrate SUB. The substrate SUB may be of a first conductivity type (e.g., p type), and a common source line CSL may be provided on the substrate SUB. The common source line CSL may extend in the second horizontal direction HD2 and be doped with impurities of a second conductivity type (e.g., n type). A plurality of insulating layers IL may extend in the second horizontal direction HD2 and be sequentially provided in the vertical direction VD on a region of the substrate SUB between two adjacent common source lines CSL. Also, the plurality of insulating layers IL may be spaced a specific distance apart from one another in the vertical direction VD. For example, the plurality of insulating layers IL may include an insulating material, such as silicon oxide.

A plurality of pillars P, each of which may be provided on a region of the substrate SUB between two adjacent common source lines CSL, may be sequentially located in the first horizontal direction HD1 and penetrate the plurality of insulating layers IL in the vertical direction VD. For example, the plurality of pillars P may penetrate the plurality of insulating layers IL and contact the substrate SUB. Specifically, a surface layer S of each of the pillars P may include a silicon material of the first conductivity type and function as a channel region. Meanwhile, an inner layer I of each of the pillars P may include an insulating material, such as silicon oxide, or an air gap.

A charge storage layer CS may be provided in a region between two adjacent common source lines CSL along exposed surfaces of the insulating layers IL, the pillars P, and the substrate SUB. The charge storage layer CS may include a gate insulating layer (or referred to as a 'tunneling insulating layer'), a charge trap layer, and a blocking insulating layer. For example, the charge storage layer CS may include an oxide-nitride-oxide (ONO) structure. Also, gate electrodes GE, such as the selection lines GSL and SSL and the word lines WL1 to WL8, may be provided in a region between two adjacent common source lines CSL on an exposed surface of the charge storage layer CS.

Drains or drain contacts DR may be provided on the plurality of pillars P, respectively. For example, the drains or drain contacts DR may include a silicon material doped with impurities of the second conductivity type. Bit lines BL1 to BL3 may be provided on the drains DR. The bit lines BL1 to BL3 may extend in the first horizontal direction HD1 and be spaced a specific distance apart from one another in the second horizontal direction HD2.

When the memory cell array 110 of non-volatile memory device 100 is a 3D memory cell array as shown in FIGS. 2-4, the number of word lines WL1 to WL8 vertically stacked on the substrate SUB may be increased to improve the integration density of non-volatile memory device 100. As the number of word lines WL1 to WL8 vertically stacked on the substrate SUB increases, a distance between the word lines WL1 to WL8 may be reduced. As a result, parasitic capacitances of a plate type between the word lines WL1 to WL8 may be increased. Since a loading time of the word lines WL1 to WL8 corresponds to the product of a resistance and a capacitance, the loading time of the word lines WL1 to WL8 may increase with an increase in capacitance.

The increase in the loading time of the word lines WL1 to WL8 may lead to an increase in time taken for a sensing operation (e.g., a read operation, a program verification operation, or an erase verification operation) on non-volatile memory device 100. Thus, the sensing performance of non-volatile memory device 100 may be reduced. Accordingly, to improve both the integration density and performance of non-volatile memory device 100, a method of increasing the number of word lines WL1 to WL8 vertically stacked on the substrate SUB and reducing the loading time of the word lines WL1 to WL8 may be required.

Referring back to FIG. 1, to reduce the loading time of the word lines, when control logic circuit 120 performs a sensing operation on memory cell array 110, a selection voltage applied to a selected word line connected to a selected memory cell may be controlled in three stages. Specifically, control logic circuit 120 may divide a sensing time for which the sensing operation is performed, into a first section or interval, a second section or interval, and a third section or interval, and may determine voltage levels of the selection voltage in the first to third sections. Here, the first and second sections may correspond to a word line setup time for setting a selection voltage to a target voltage level required to perform the sensing operation, and the third section may correspond to a time for applying a target voltage level to the selected word line. The word line driving operation will be described in detail below with reference to FIG. 5.

In addition, control logic circuit 120 may output various control signals (e.g., a voltage control signal CTRL_vol, a row address X-ADDR, and a column address Y-ADDR) for programming data to memory cell array 110, reading data from memory cell array 110, or erasing data stored in memory cell array 110, based on a command CMD, an address ADDR, and a control signal CTRL. Thus, control logic circuit 120 may generally control various operations of non-volatile memory device 100.

Voltage generator 130 may generate various kinds of voltages for performing program, read, and erase operations on memory cell array 110 based on the voltage control signal CTRL_vol. Specifically, voltage generator 130 may generate a word line voltage VWL, for example, a program voltage, a read voltage, a pass voltage, an erase verification voltage, or a program verification voltage. Also, voltage generator 130 may further generate a string selection line voltage and a ground selection line voltage based on the voltage control signal CTRL_vol.

In an embodiment, when voltage generator 130 performs the sensing operation on memory cell array 110, voltage generator 130 may provide a word line voltage VWL having a first voltage level to the selected word line in the first section of the sensing time, provide a word line voltage VWL having a second voltage level to the selected word line in the second section of the sensing time, and provide a word line voltage VWL having a target voltage level to the selected word line in the third section of the sensing time. The second voltage level may be different from the first voltage level, and the target voltage level may be different from the second voltage level. Also, when voltage generator 130 performs a sensing operation on memory cell array 110, a pass voltage Vpass may be provided to an adjacent word line adjacent to the selected word line.

Row decoder 140 may select one of a plurality of memory blocks in response to the row address X-ADDR, select one of the word lines WL of the selected memory block, and select one of a plurality of string selection lines SSL. Page buffer unit 150 may select some of the bit lines BL in response to the column address Y-ADDR. Specifically, page buffer unit 150 may operate as a write driver or a sense amplifier according to an operation mode.

Figure 5:
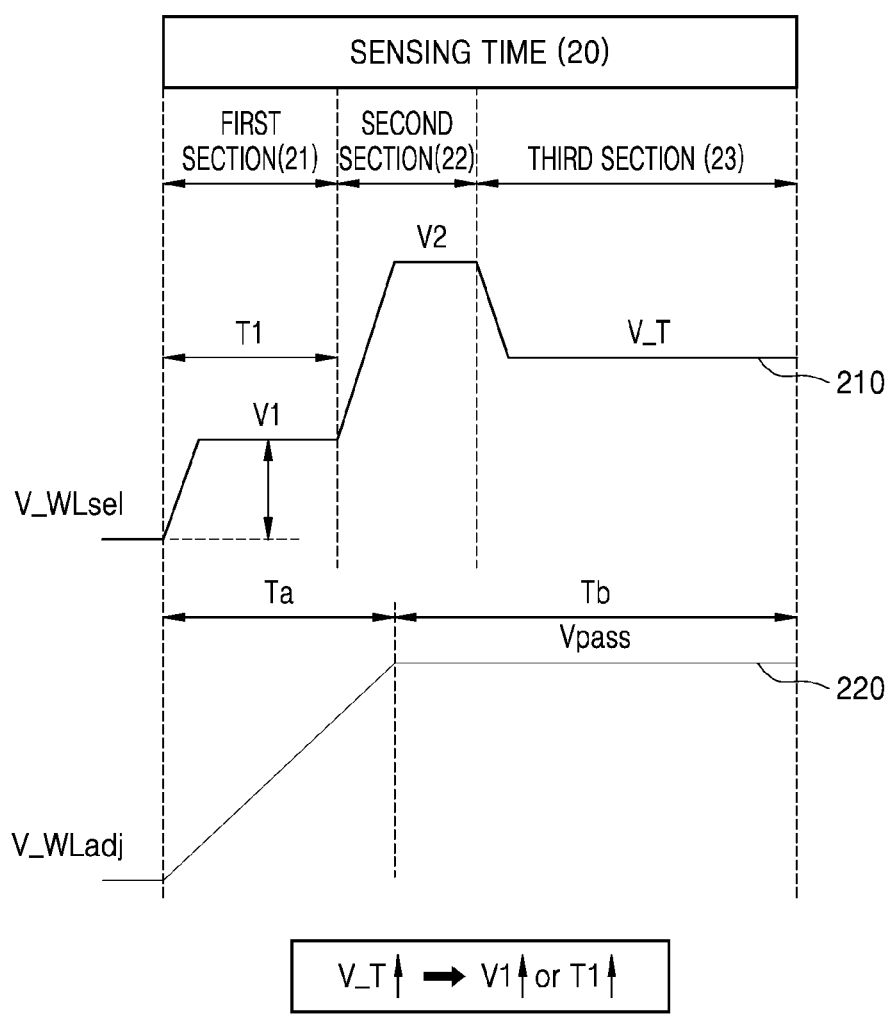
FIG. 5 is a diagram of a word line driving operation according to an embodiment.

FIG. 5 is a diagram of a word line driving operation according to an embodiment.

Referring to FIGS. 1 and 5, a sensing time 20 taken for a sensing operation on non-volatile memory device 100 may be divided into a first section 21, a second section 22, and a third section 23. In an embodiment, the sensing operation may correspond to a read operation. In an embodiment, the sensing operation may correspond to a program verification operation. In an embodiment, the sensing operation may correspond to an erase verification operation. However, embodiments are not limited thereto, and the sensing operation may include arbitrary operations for detecting a state of a memory cell, for example, a threshold voltage of the memory cell.

Control logic circuit 120 may control a selected word line voltage V_WLsel, which is applied to a selected word line connected to a selected memory cell, as shown by a curve 210 to sense a state of the selected memory cell during sensing time 20. Here, curve 210 shows a voltage level applied to the selected word line with respect to time. Control logic circuit 120 may control the selected word line voltage V_WLsel in three stages. Thus, sensing time 20 may be divided into first section 21, second section 22, and third section 23.

In an embodiment, when a target voltage level V_T is greater than or equal to a critical voltage level, control logic circuit 120 may control the selected word line voltage V_WLsel in three stages as shown by curve 210. The critical voltage level may be a predetermined voltage level. In some embodiments, the critical voltage level may be determined differently for each word line, each memory block, each memory plane, or each memory chip. In some embodiments, the critical voltage level may be determined differently according to a number of data bits written to a selected memory cell, temperature information, a count of cycles of program/erase operations on the selected memory cell, a number of program loops, a threshold voltage of the selected memory cell, a threshold voltage of an adjacent memory cell adjacent to the selected memory cell, or an operation mode of the non-volatile memory device. When the target voltage level V_T is less than the critical voltage level, control logic circuit 120 may control the selected word line voltage V_WLsel in two stages. For example, control logic circuit 120 may control the selected word line voltage V_WLsel to omit first section 21.

Control logic circuit 120 may control an adjacent word line voltage V_WLadj, which is applied to an adjacent word line adjacent to the selected word line during sensing time 20, as shown by a curve 220. Here, curve 220 shows a voltage level applied to the adjacent word line with respect to time. For example, when the selected word line is a word line WL4 of FIG. 4, the adjacent word line may be a word line WL3 or WL5 of FIG. 4. A pass voltage Vpass may be applied to the adjacent word line during sensing time 20. The pass voltage Vpass may be greater than the target voltage level V_T. A first time Ta may correspond to a voltage rise time of the adjacent word line, and a second time Tb may correspond to a time for which the pass voltage Vpass is applied to the adjacent word line.

Figure 6A:
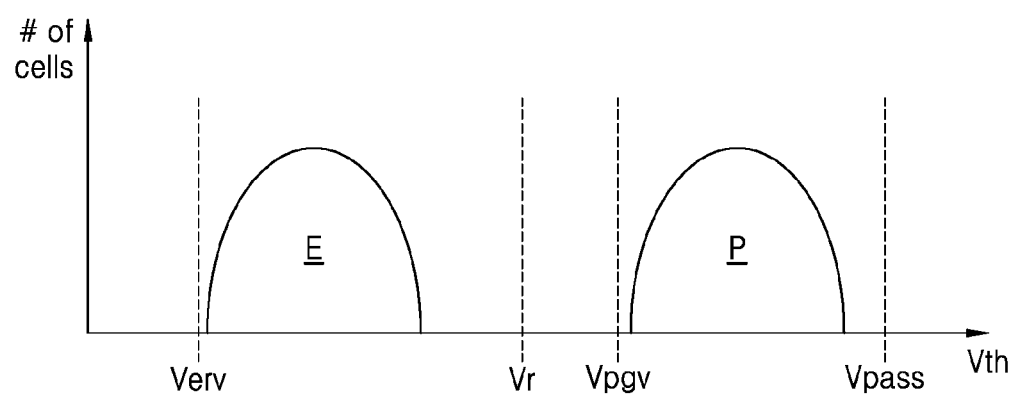
FIGS. 6A and 6B are graphs showing threshold voltage distributions of memory cells, according to embodiments.
Figure 6B:
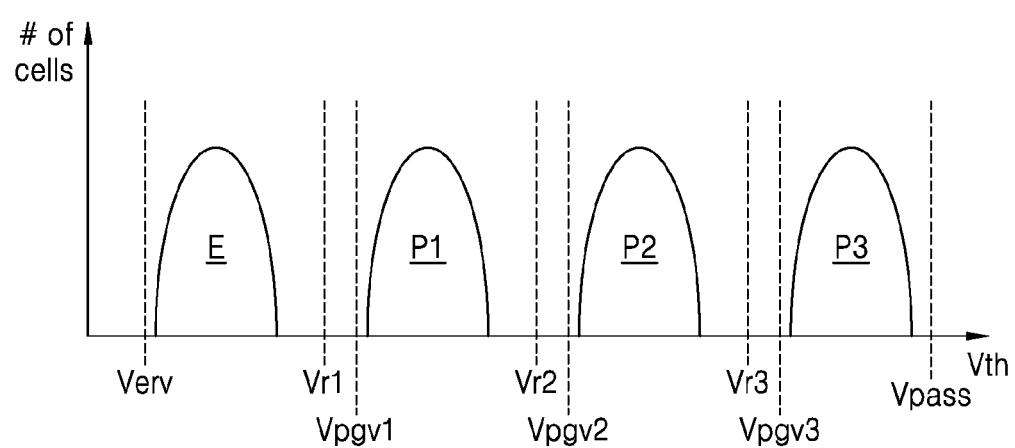

FIGS. 6A and 6B are graphs showing threshold voltage distributions of memory cells, according to embodiments.

Referring to FIG. 6A, the abscissa denotes a threshold voltage Vth and the ordinate denotes the number of memory cells. In an embodiment, the memory cells may be single-level cells and be programmed to have a state corresponding to one of an erase state E and a program state P. For example, when a read operation is performed on a memory device, a read voltage Vr may be applied to a selected word line, and a pass voltage Vpass may be applied to an unselected word line. Thus, since the pass voltage Vpass is applied to the unselected word line, memory cells connected to the unselected word line may be turned on regardless of the threshold voltage Vth.

For example, when a program verification operation is performed on the memory device, a program verification voltage Vpgv may be applied to the selected word line, and the pass voltage Vpass may be applied to the unselected word line. For example, when an erase verification operation is performed on the memory device, an erase verification voltage Very may be applied to the selected word line, and the pass voltage Vpass may be applied to the unselected word line. However, embodiments are not limited thereto, and the pass voltage Vpass may be respectively different in the read operation, the program verification operation, and the erase operation.

Referring to FIG. 6B, the abscissa denotes a threshold voltage Vth and the ordinate denotes the number of memory cells. In an embodiment, the memory cells may be multi-level cells and be programmed to have a state corresponding to one of an erase state E and first to third program states P1 to P3. For example, when a read operation is performed on the memory device, one of first to third read voltages Vr1, Vr2, and Vr3 may be applied to the selected word line, and a pass voltage Vpass may be applied to the unselected word line. Thus, since the pass voltage Vpass is applied to the unselected word line, memory cells connected to the unselected word line may be turned on regardless of the threshold voltage Vth.

For instance, when a program verification operation is performed on the memory device, one of first to third program verification voltages Vpgv1, Vpgv2, and Vpgv3 may be applied to the selected word line, and a pass voltage Vpass may be applied to the unselected word line. For example, when an erase verification operation is performed on the memory device, an erase verification voltage Very may be applied to the selected word line, and a pass voltage Vpass may be applied to the unselected word line. However, embodiments are not limited thereto, and the pass voltage Vpass may be respectively different in the read operation, the program verification operation, and the erase operation.

As described above, the memory cells may be single-level cells (SLCs) as shown in FIG. 6A or multi-level cells (MLCs) as shown in FIG. 6B. However, embodiments are not limited to the memory cells shown in FIGS. 6A and 6B. The memory cells may be triple-level cells (TLCs) capable of storing 3-bit data or quad-level cells (QLCs) capable of storing 4-bit data. Methods of driving word lines according to various embodiments may also be applied to TLCs, QLCs, or cells capable of storing data of 5 bits or more.

Referring back to FIG. 5, in a first section 21 of sensing time 20, the selected word line voltage V_WLsel may be determined to be a first voltage level V1, and voltage generator 130 may provide the first voltage level V1 to the selected word line. When a high voltage, such as a pass voltage Vpass, is applied to an adjacent word line, coupling noise may occur in the selected word line. To inhibit the coupling noise, the first voltage level V1 may be provided to the selected word line during first section 21. Thus, first section 21 may be referred to as a "noise inhibition section" or a "noise reduction section." In an embodiment, first section 21 may be shorter than the first time Ta (i.e., the voltage rise time of an adjacent word line). Thus, an undesired couple-up distortion phenomenon of the adjacent word line may be improved during a setup operation (e.g., an overdrive operation) of second section 22. However, embodiments are not limited thereto. In some embodiments, a duration of first section 21 may be longer than the first time Ta. In some embodiments, first section 21 may be substantially equal to the first time Ta.

In second section 22 of sensing time 20, the selected word line voltage V_WLsel may be determined to be a second voltage level V2, and voltage generator 130 may provide the second voltage level V2 to the selected word line. The second voltage level V2 may correspond to an "overdrive voltage." Since the second voltage level V2 is applied to the selected word line, the selected word line may be set to a target voltage level V_T earlier, thus at least partially compensating for a delay in reaching the target voltage level V_T due to loading of a parasitic capacitance to one or more adjacent word lines. Thus, second section 22 may be referred to as an "overdrive section." Also, the second voltage level V2 may have an offset greater or less than the target voltage level V_T. Thus, the second voltage level V2 may be referred to as an "offset pulse."

In an embodiment, when the target voltage level V_T is greater than the first voltage level V1, the second voltage level V2 may be greater than the target voltage level V_T. In an embodiment, when the target voltage level V_T is less than the first voltage level V1, the second voltage level V2 may be less than the target voltage level V_T. As described above, control logic circuit 120 may overdrive the selected word line in second section 22 so that a voltage of the selected word line may rapidly reach the target voltage level V_T. According to the present embodiment, since the first voltage level V1 is previously applied to the selected word line in first section 21, the second voltage level V2 may be stably applied to the selected word line in second section 22 so that an overdrive operation may be efficiently performed.

In third section 23 of sensing time 20, the selected word line voltage V_WLsel may be determined to be the target voltage level V_T, and voltage generator 130 may provide the target voltage level V_T to the selected word line. Thus, third section 23 may be referred to as a "target section." In an embodiment, when a read operation is performed on non-volatile memory device 100, the target voltage level V_T may be a read voltage (e.g., Vr of FIG. 6A or Vr1, Vr2, or Vr3 of FIG. 6B). When the read voltage is applied to the selected word line, data written to a memory cell may be read depending on whether the memory cell is on or off. In some embodiments, the target voltage level V_T for a read operation (i.e., Vr in FIG. 6A) may be selected to minimize a data read error rate when reading memory cells, such as a voltage between the distribution of erased memory cells ("E" in FIG. 6A) and the distribution of programmed memory cells ("P" in FIG. 6A). Thus, the target voltage level V_T may increase or decrease depending on the distribution of the threshold voltages of the non-volatile memory cells in non-volatile memory device 100.

In an embodiment, when a program verification operation is performed on non-volatile memory device 100, the target voltage level V_T may be a program verification voltage (e.g., Vpgv of FIG. 6A or Vpgv1, Vpgv2, or Vpgv3 of FIG. 6B). When the program verification voltage is applied to the selected word line, it may be determined whether a program operation on the memory cell is completed, depending on whether the memory cell is on or off. In an embodiment, when an erase verification operation is performed on non-volatile memory device 100, the target voltage level V_T may be an erase verification voltage (e.g., Very of FIG. 6A or FIG. 6B). When the erase verification voltage is applied to the selected word line, it may be determined whether an erase operation on the memory cell is completed, depending on whether the memory cell is on or off. In similarity to the explanation above with respect to a read operation, the target voltage level V_T for a program verification operation (i.e., Vpgv in FIG. 6A) and the target voltage level V_T for an erase verification operation (i.e., Very in FIG. 6A) may increase or decrease depending on the distribution of the threshold voltages of the non-volatile memory cells in non-volatile memory device 100.

When a voltage is applied to the selected word line, a setup time taken to reach the target voltage level V_T may vary according to a distance from voltage generator 130 to the selected word line. For example, when the distance from voltage generator 130 to the selected word line is short, that is, when the selected word line is a word line near voltage generator 130, a word line setup time may be relatively short. In contrast, when the distance from voltage generator 130 to the selected word line is long, that is, when the selected word line is a word line far from voltage generator 130, the word line setup time may be relatively long. However, since the second voltage level V2 is applied in second section 22 and the target voltage level V_T is then applied in third section 23, a word line loading time may be reduced regardless of the distance between voltage generator 130 and the selected word line. As a result, the sensing performance of non-volatile memory device 100 may be improved.

In an embodiment, the first voltage level V1 may be variably determined according to the target voltage level V_T. As the target voltage level V_T becomes greater, the first voltage level V1 may become greater. As described above, by determining the first voltage level V1 according to the target voltage level V_T, an overdrive operation may be efficiently performed in second section 22. For example, the target voltage level V_T may be a positive voltage as described in detail below with reference to FIG. 7.

In FIG. 5, the first voltage level V1 may be less than the target voltage level V_T. However, embodiments are not limited thereto. In some embodiments, the first voltage level V1 may be greater than the target voltage level V_T as will be described below with reference to FIG. 9. In some embodiments, the target voltage level V_T may be a negative voltage as described in detail below with reference to FIG. 10.

In an embodiment, a first control time T1 may be variably determined according to the target voltage level V_T. For example, as the target voltage level V_T becomes greater, the first control time T1 may increase. As described above, by determining the first control time T1 according to the target voltage level V_T, an overdrive operation may be efficiently performed in second section 22. In this case, first section 21 may correspond to the first control time T1.

In an embodiment, the first control time T1 may include a rise time of a word line voltage and a maintenance time of the word line voltage as will be described in detail below with reference to FIG. 8. However, embodiments are not limited thereto. In an embodiment, the first control time T1 may include only the maintenance time of the word line voltage as will be described in detail below with reference to FIG. 11. In an embodiment, as the target voltage level V_T becomes greater, the first voltage level V1 may become greater, and a duration of the first control time T1 may become longer.

Figure 7:
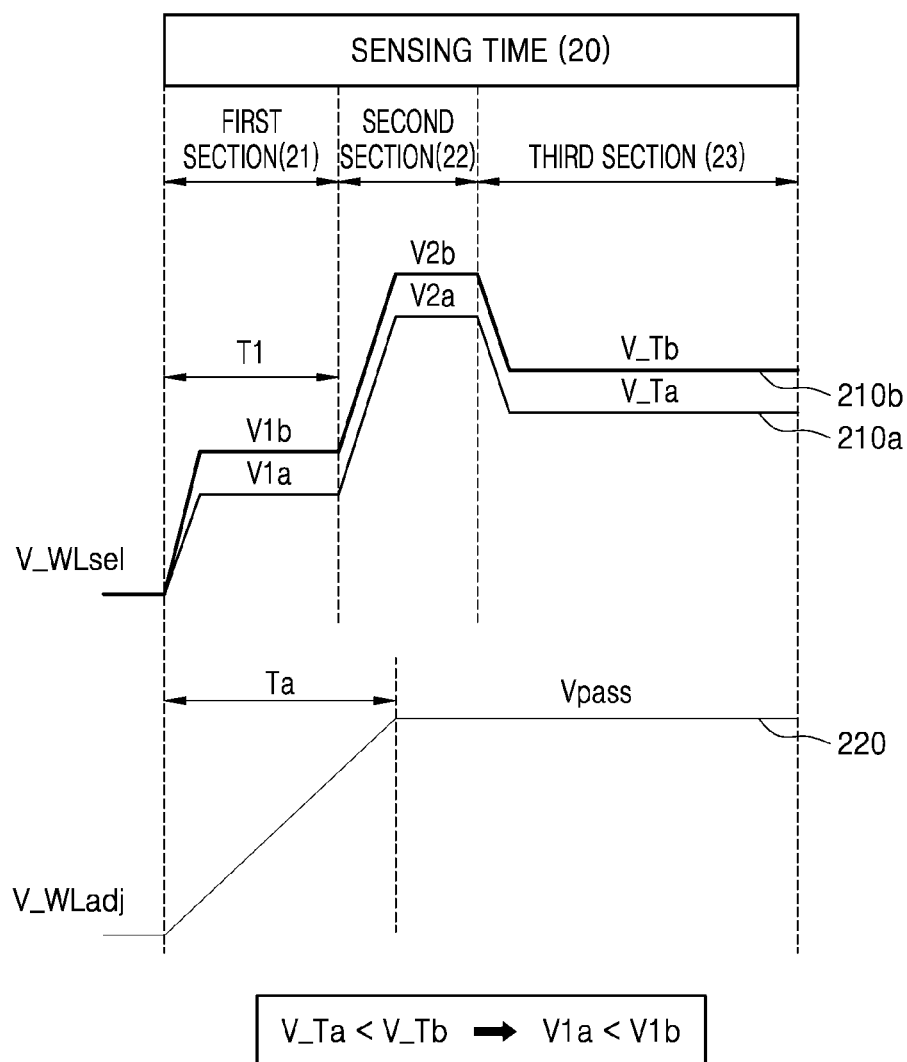
FIGS. 7, 8, 9, 10 and 11 are diagrams showing word line driving operations according to embodiments.

FIG. 7 is a diagram of a word line driving operation according to an embodiment. FIG. 7 corresponds to an embodied example of the word line driving operation shown in FIG. 5, and repeated description thereof will be omitted.

Referring to FIG. 7, a first target voltage level V_Ta may be less than a second target voltage level V_Tb. For example, the first target voltage level V_Ta may correspond to the first read voltage Vr1 of FIG. 6B, and the second target voltage level V_Tb may correspond to the second read voltage Vr2 of FIG. 6B. When control logic circuit 120 performs a sensing operation using the first target voltage level V_Ta, control logic circuit 120 may control a selected word line voltage V_WLsel applied to a selected word line during sensing time 20 as shown by a first curve 210a. Meanwhile, when control logic circuit 120 performs a sensing operation using the second target voltage level V_Tb, control logic circuit 120 may control the selected word line voltage V_WLsel applied to the selected word line during sensing time 20 as shown by a second curve 210b.

According to first curve 210a, in first section 21, the selected word line voltage V_WLsel may be determined to be a first voltage level V1a based on the first target voltage level V_Ta, and voltage generator 130 may provide the first voltage level V1a to the selected word line. Also, in second section 22, the selected word line voltage V_WLsel may be determined to be a second voltage level V2a, and voltage generator 130 may provide the second voltage level V2a to the selected word line. In third section 23, the selected word line voltage V_WLsel may be determined to be the first target voltage level V_Ta, and voltage generator 130 may provide the first target voltage level V_Ta to the selected word line.

According to second curve 210b, in first section 21, the selected word line voltage V_WLsel may be determined to be a first voltage level V1b based on the second target voltage level V_Tb, and voltage generator 130 may provide the first voltage level V1b to the selected word line. Also, in second section 22, the selected word line voltage V_WLsel may be determined to be a second voltage level V2b, and voltage generator 130 may provide the second voltage level V2b to the selected word line. In third section 23, the selected word line voltage V_WLsel may be determined to be the second target voltage level V_Tb, and voltage generator 130 may provide the second target voltage level V_Tb to the selected word line.

When comparing first and second curves 210a and 210b, the first voltage level V1a may be less than the first voltage level V1b. Also, the second voltage level V2a may be less than the second voltage level V2b. However, embodiments are not limited thereto, and the second voltage levels V2a and V2b may be equal to each other. When comparing first and second curves 210a and 210b, a length of first section 21 may be equal to a first control time T1. In this case, the first control time T1 may be shorter than a first time Ta, which is a rise time of an adjacent word line voltage V_WLadj.

Figure 8:
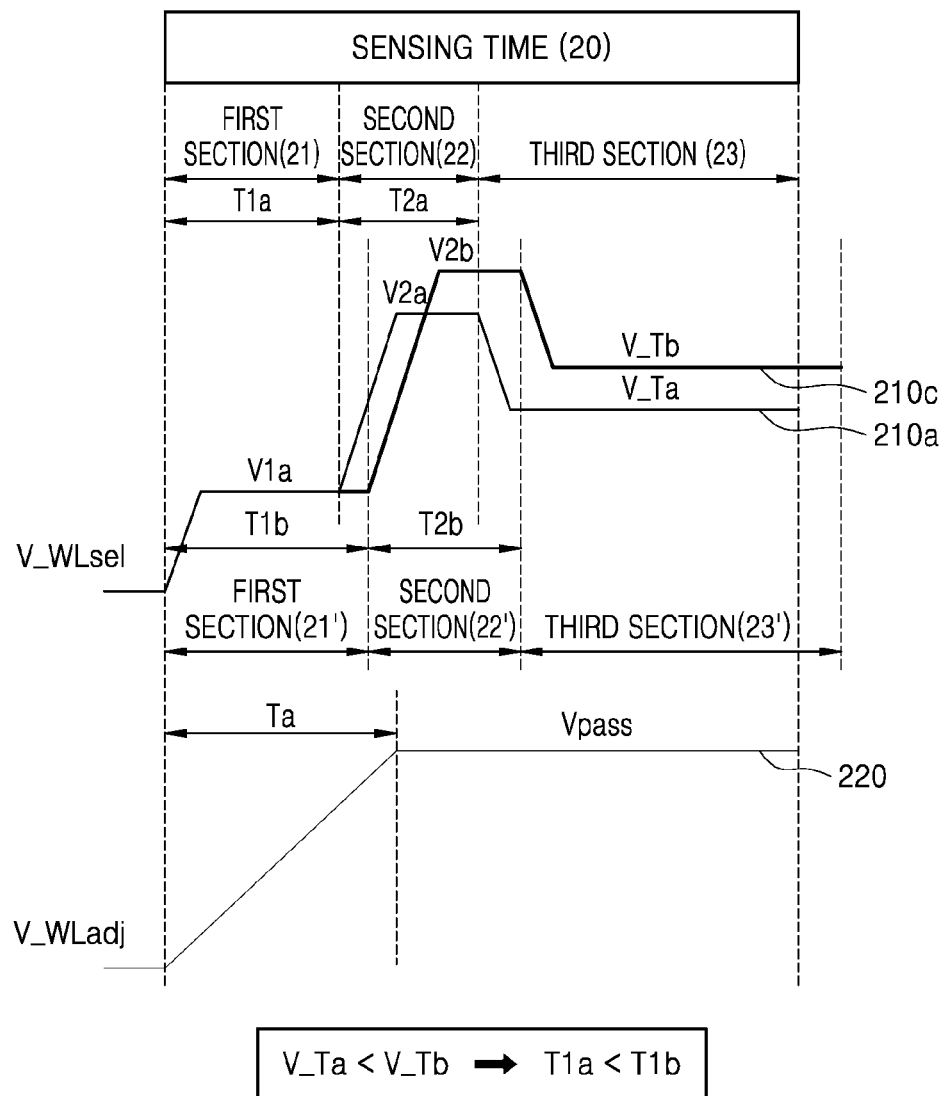

FIG. 8 is a diagram of a word line driving operation according to an embodiment. FIG. 8 corresponds to an embodied example of the word line driving operation shown in FIG. 5, and repeated description thereof will be omitted.

Referring to FIG. 8, a first target voltage level V_Ta may be less than a second target voltage level V_Tb. For example, the first target voltage level V_Ta may correspond to the first read voltage Vr1 of FIG. 6B, and the second target voltage level V_Tb may correspond to the second read voltage Vr2 of FIG. 6B. When control logic circuit 120 performs a sensing operation using the first target voltage level V_Ta, control logic circuit 120 may control a selected word line voltage V_WLsel, which is applied to a selected word line during a sensing time 20, as shown by first curve 210a. Meanwhile, when control logic circuit 120 performs a sensing operation using the second target voltage level V_Tb, control logic circuit 120 may control the selected word line voltage V_WLsel, which is applied to the selected word line during sensing time 20, as shown by a third curve 210c. The present embodiment corresponds to a modified example of the word line driving operation shown in FIG. 7, and repeated descriptions thereof will be omitted.

According to first curve 210a, in a first section 21, the selected word line voltage V_WLsel may be determined to be a first voltage level V1a, and a length of first section 21 may be determined to be a first control time T1a based on the first target voltage level V_Ta. Thus, voltage generator 130 may provide the first voltage level V1a to the selected word line during the first control time T1a. In a second section 22, the selected word line voltage V_WLsel may be determined to be a second voltage level V2a, and a length of second section 22 may be determined to be a second control time T2a. Thus, voltage generator 130 may provide the selected voltage level V2a to the selected word line during the second control time T2a. In a third section 23, the selected word line voltage V_WLsel may be determined to be the first target voltage level V_Ta, and voltage generator 130 may provide the first target voltage level V_Ta to the selected word line.

According to third curve 210c, in a first section 21', the selected word line voltage V_WLsel may be determined to be the first voltage level V1a, and a length of the first section 21' may be determined to be a first control time T1b based on the second target voltage level V_Tb. Thus, voltage generator 130 may provide the first voltage level V1a to the selected word line during the first control time T1b. In a second section 22', the selected word line voltage V_WLsel may be determined to be a second voltage level V2b, and a length of second section 22' may be determined to be a second control time T2b. Thus, voltage generator 130 may provide the second voltage level V2b to the selected word line during the second control time T2b. In a third section 23', the selected word line voltage V_WLsel may be determined to be the second target voltage level V_Tb, and voltage generator 130 may provide the second target voltage level V_Tb to the selected word line.

When comparing first and third curves 210a and 210c, the first control time T1a may be shorter than the first control time T1b. Meanwhile, the second control time T2a may be equal to the second control time T2b. However, embodiments are not limited thereto, and the second control time T2a may be different from the second control time T2b. In addition, the second voltage level V2a may be less than the second voltage level V2b. However, embodiments are not limited thereto, and the second voltage levels V2a and V2b may be equal to each other. In this case, each of the first control times T1a and T1b may be shorter than a first time Ta, which is a rise time of an adjacent word line voltage V_WLadj.

Figure 9:
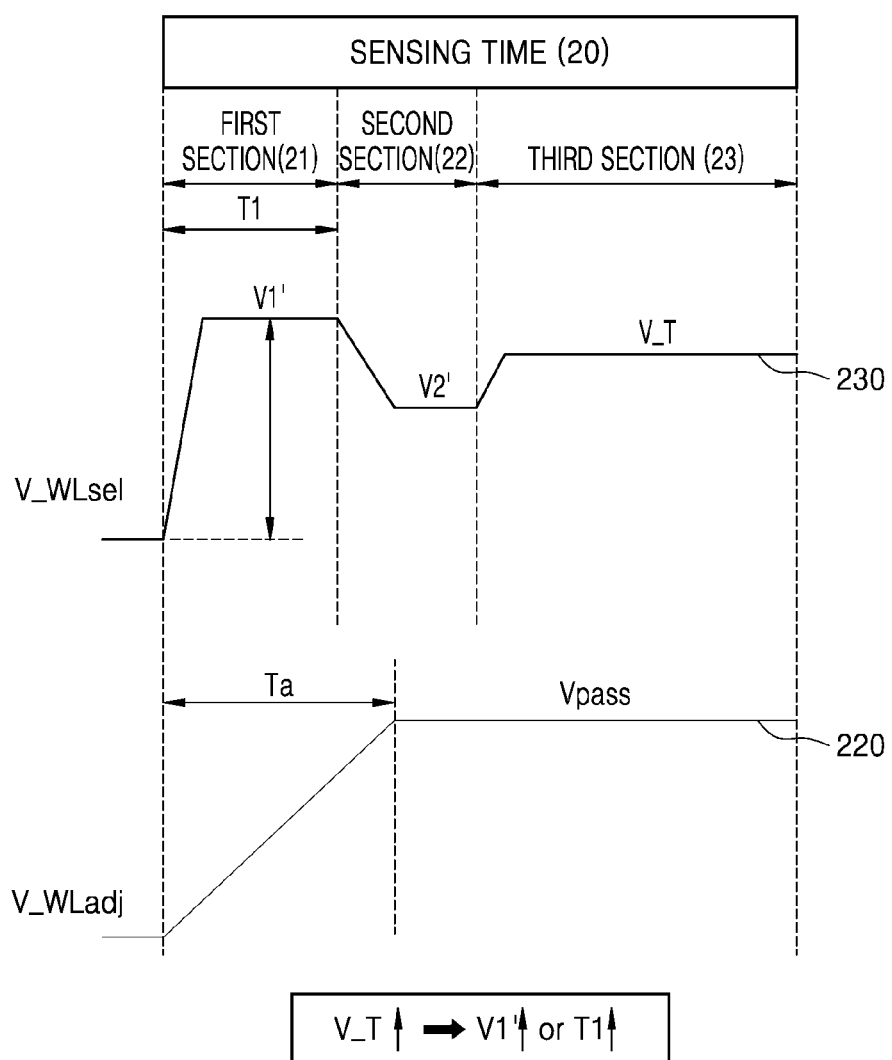

FIG. 9 is a diagram of a word line driving operation according to an embodiment. FIG. 9 corresponds to a modified example of the word line driving operation shown in FIG. 5, and repeated descriptions thereof will be omitted.

Referring to FIG. 9, a first voltage level V1' may be greater than a target voltage level V_T. For example, the target voltage level V_T may be a read voltage Vr of FIG. 6A or first to third read voltages Vr1, Vr2, and Vr3 of FIG. 6B. The control logic circuit 120 may control a selected word line voltage V_WLsel, which is applied to a selected word line during a sensing time 20, as shown by a curve 230.

In first section 21, the selected word line voltage V_WLsel may be determined to be a first voltage level V1' based on a target voltage level V_T. Also, in a first section 21, a length of first section 21 may be determined to be a first control time T1 based on the target voltage level V_T. voltage generator 130 may provide a first voltage level V1' to the selected word line during a first control time T1. The first voltage level V1' may be greater than the target voltage level V_T. The first control time T1 may be shorter than a first time Ta. For instance, as the target voltage level V_T becomes greater, the first voltage level V1' may become greater, and a duration of the first control time T1 may become longer.

In a second section 22, the selected word line voltage V_WLsel may be determined to be a second voltage level V2', and voltage generator 130 may provide the second voltage level V2' to the selected word line. The second voltage level V2' may be less than the first voltage level V1' and the target voltage level V_T. In a third section 23, the selected word line voltage V_WLsel may be determined to be target voltage level V_T, and voltage generator 130 may provide the target voltage level V_T to the selected word line.

Figure 10:
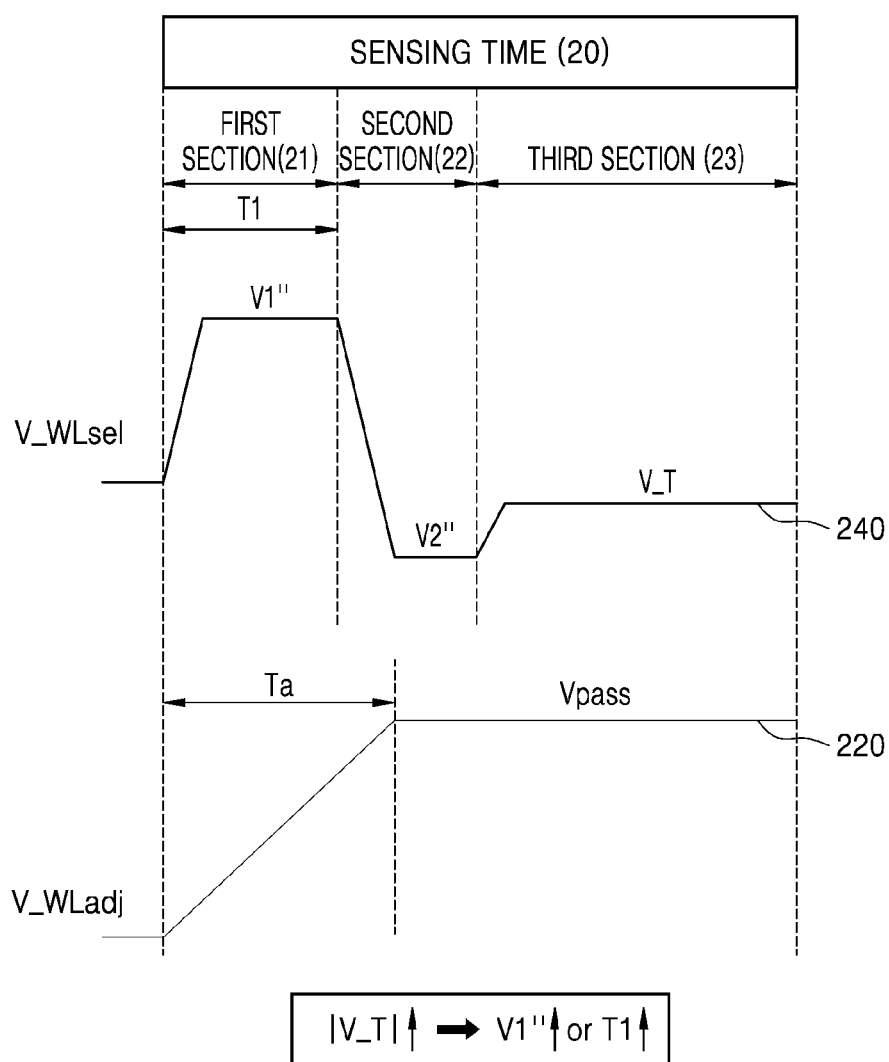

FIG. 10 is a diagram of a word line driving operation according to an embodiment. FIG. 10 corresponds to a modified example of the word line driving operation shown in FIG. 5, and repeated descriptions thereof will be omitted.

Referring to FIG. 10, a target voltage level V_T may be a negative voltage. For example, the target voltage level V_T may be the erase verification voltage Very of FIG. 6A or FIG. 6B. Thus, when the target voltage level V_T is the negative voltage, control logic circuit 120 may control a selected word line voltage V_WLsel, which is applied to a selected word line during a sensing time 20, as shown by a curve 240.

In a first section 21, the selected word line voltage V_WLsel may be determined to be a first voltage level V1'' based on a magnitude of the target voltage level V_T. Also, in first section 21, a length of first section 21 may be determined to be a first control time T1 based on the target voltage level V_T. Voltage generator 130 may provide a first voltage level V1'' to the selected word line during the first control time T1. The first voltage level V1'' may be greater than the target voltage level V_T. The first control time T1 may be shorter than a first time Ta. For instance, as the magnitude of the target voltage level V_T becomes greater, the first voltage level V1'' may become greater and/or a duration of the first control time T1 may become longer.

In a second section 22, the selected word line voltage V_WLsel may be determined to be a second voltage level V2'', and voltage generator 130 may provide the second voltage level V2'' to the selected word line. The second voltage level V2'' may be a negative voltage, and a magnitude of the second voltage level V2'' may be greater than that of the target voltage level V_T (i.e., V2'' may be more negative than V_T). In a third section 23, the selected word line voltage V_WLsel may be determined to be the target voltage level V_T, and voltage generator 130 may provide the target voltage level V_T to the selected word line.

Figure 11:
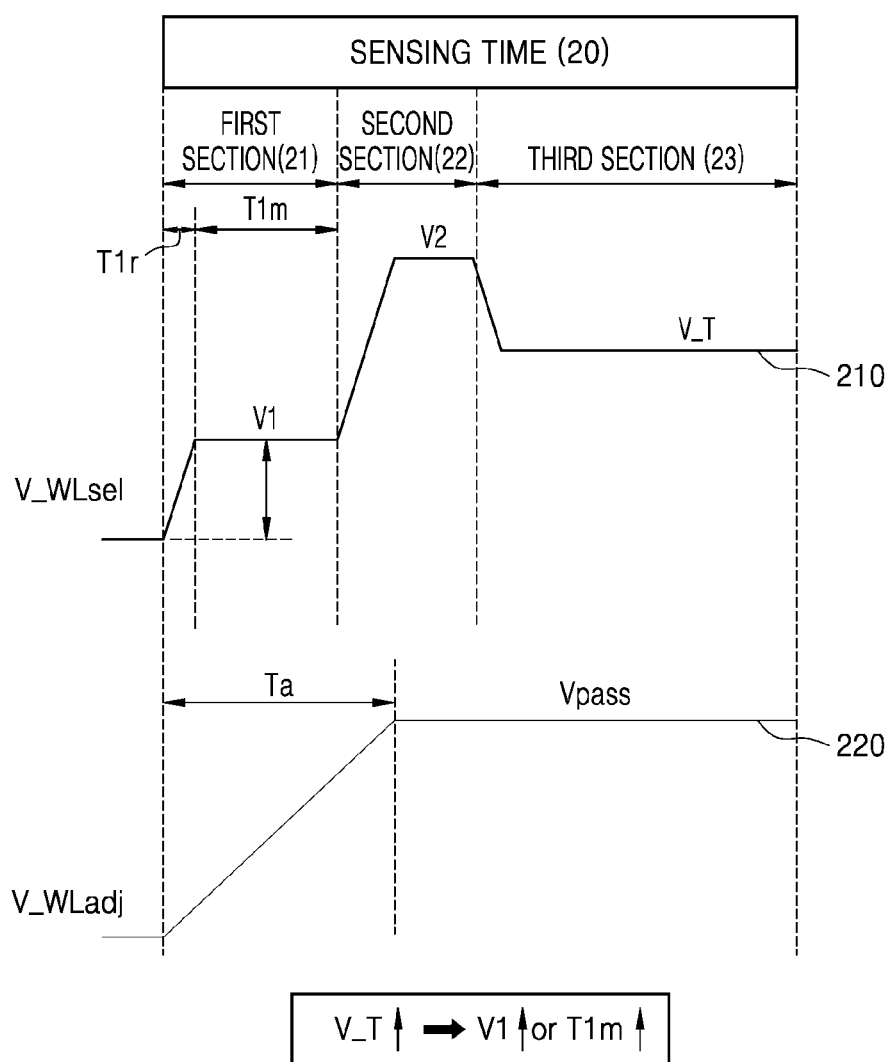

FIG. 11 is a diagram of a word line driving operation according to an embodiment. FIG. 11 corresponds to a modified example of the word line driving operation shown in FIG. 5, and repeated descriptions thereof will be omitted.

Referring to FIG. 11, a first section 21 may include a voltage rise time T1r and a voltage maintenance time T1m. According to the present embodiment, a voltage maintenance time T1m may vary according to a target voltage level V_T. For example, as the target voltage level V_T becomes greater, a duration of the voltage maintenance time T1m may become longer. In this case, the voltage rise time T1r may be constant regardless of the target voltage level V_T. As a result, a length of first section 21 may increase with the target voltage level V_T.

Figure 12:
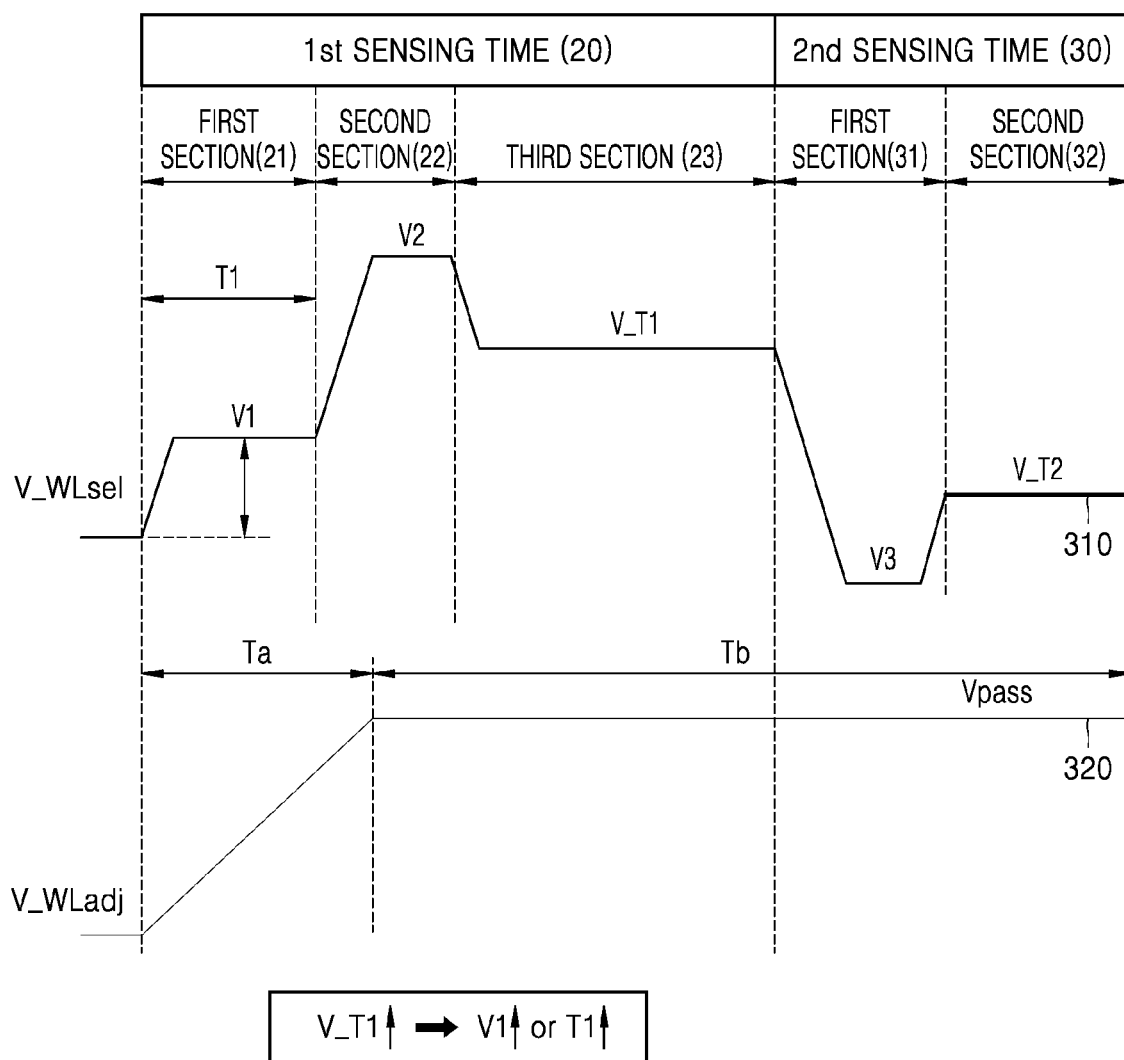
FIG. 12 is a diagram showing a word line driving operation when a plurality of sensing operations is performed on an embodiment of a non-volatile memory device.

FIG. 12 is a diagram showing a word line driving operation when a plurality of sensing operations are performed on an embodiment of a non-volatile memory device 100.

Referring to FIG. 12, a first sensing operation and a second sensing operation may be sequentially performed on non-volatile memory device 100. The first sensing operation may be performed during a first sensing time 20, and a second sensing operation may be performed during a second sensing time 30. For example, first sensing time 20 may correspond to sensing time 20 of FIG. 5. A control logic circuit 120 may control a selected word line voltage V_WLsel, which is applied to a selected word line during first and second sensing times 20 and 30, as shown by a first curve 310.

Meanwhile, control logic circuit 120 may control an adjacent word line voltage V_WLadj, which is applied to an adjacent word line during first and second sensing times 20 and 30, as shown by a second curve 320. A pass voltage Vpass may be applied to the adjacent word line during first and second sensing times 20 and 30. The pass voltage Vpass may be greater than first and second target voltage levels V_T1 and V_T2. A first time Ta may correspond to a voltage rise time of the adjacent word line, and a second time Tb may correspond to a time for which the pass voltage Vpass is applied to the adjacent word line.

In an embodiment, control logic circuit 120 may control the selected word line voltage V_WLsel in three stages during first sensing time 20 and control the selected word line voltage V_WLsel in two stages during second sensing time 30. A first target voltage level V_T1 of the first sensing operation may be different from a second target voltage level V_T2 of the second sensing operation. For example, the first target voltage level V_T1 may be greater than the second target voltage level V_T2. Thus, when a voltage of the adjacent word line rises during the first time Ta, the sensing performance of non-volatile memory device 100 may be improved using a couple-up phenomenon of the selected word line due to the adjacent word line. However, embodiments are not limited thereto, and the first target voltage level V_T1 may be less than the second target voltage level V_T2.

In a first section 21 of first sensing time 20, the selected word line voltage V_WLsel may be determined to be a first voltage level V1 based on the first target voltage level V_T1. Also, in first section 21, a length of first section 21 may be determined to be a first control time T1 based on the first target voltage level V_T1. Voltage generator 130 may apply the first voltage level V1 to the selected word line during the first control time T1 and inhibit coupling noise of the selected word line due to the adjacent word line.

In a second section 22 of first sensing time 20, the selected word line voltage V_WLsel may be determined to be a second voltage level V2 that is different from the first voltage level V1. Voltage generator 130 may apply the second voltage level V2 to the selected word line and overdrive the selected word line. In a third section 23 of first sensing time 20, the selected word line voltage V_WLsel may be determined to be the first target voltage level V_T1 that is different from the second voltage level V2. Voltage generator 130 may apply the first target voltage level V_T1 to the selected word line so that the first sensing operation may be performed on memory cells connected to the selected word line.

In a first section 31 of second sensing time 30, the selected word line voltage V_WLsel may be determined to be a third voltage level V3, and voltage generator 130 may apply the third voltage level V3 to the selected word line and overdrive the selected word line. In a second section 32 of second sensing time 30, the selected word line voltage V_WLsel may be determined to be the second target voltage level V_T2 that is different from the third voltage level V3. Voltage generator 130 may apply the second target voltage level V_T2 to the selected word line so that the second sensing operation may be performed on the memory cells connected to the selected word line.

In some embodiments, after second sensing time 30, a third sensing operation may be further performed on non-volatile memory device 100. In this case, control logic circuit 120 may control the selected word line voltage V_WLsel in three stages during first sensing time 20 and control the selected word line voltage V_WLsel in two stages during second sensing time 30. When a third sensing operation is performed after second sensing time 30, control logic circuit 120 may control the selected word line voltage V_WLsel in two stages during the third sensing time, too. Thus, when only the first sensing operation is performed, the control logic circuit 120 may control the selected word line voltage V_WLsel in three stages. When sensing operations are performed after the first sensing operation, the selected word line voltage V_WLsel may be controlled in two stages during each of the sensing operations.

Figure 13:
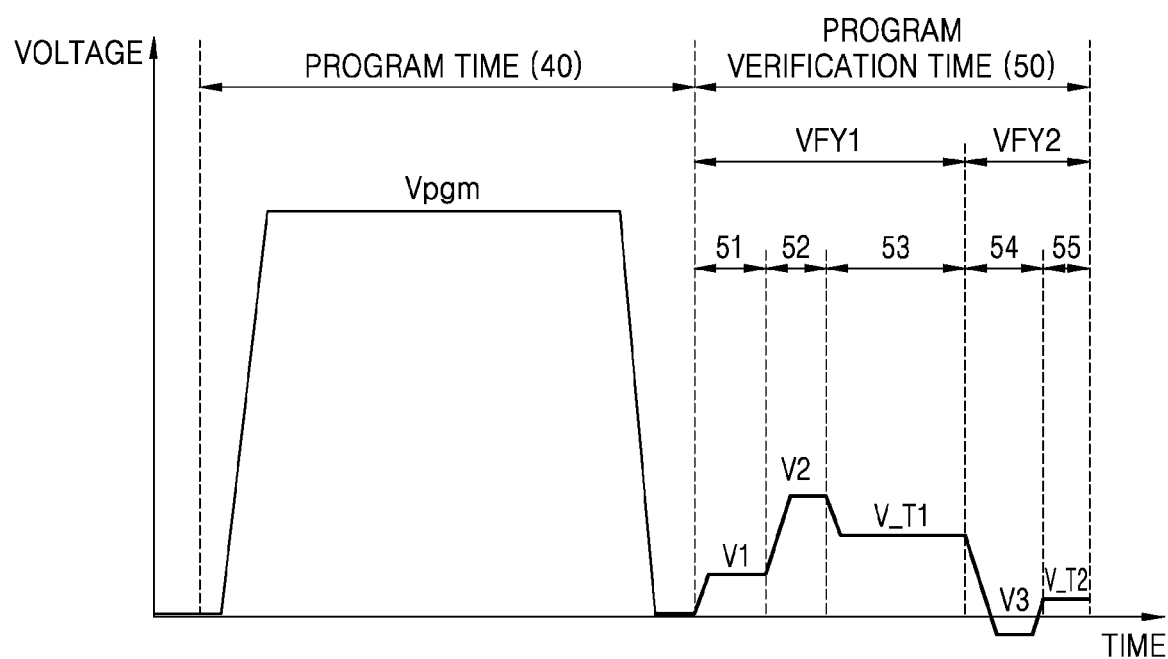
FIG. 13 is a graph showing a program operation of an embodiment of a non-volatile memory device.

FIG. 13 is a graph showing a program operation of an embodiment of a non-volatile memory device. FIG. 13 shows an example to which a word line driving method shown in FIG. 12 is applied.

Referring to FIG. 13, a program operation on the non-volatile memory device may include a program time 40 and a program verification time 50. In program time 40, a program voltage Vpgm may be applied to a selected word line connected to a selected memory cell. In program verification time 50, a first program verification voltage level V_T1 corresponding to a first target voltage level and a second program verification voltage level V_T2 corresponding to a second target voltage level may be sequentially applied to the selected word line. For example, the first program verification voltage level V_T1 corresponding to the first target voltage level may be greater than the second program verification voltage level V_T2 corresponding to the second target voltage level.

For example, program verification time 50 may include a first verification time VFY1 and a second verification time VFY2. The first verification time VFY1 may be divided into a first section 51, a second section 52, and a third section 53, which may respectively correspond to first to third sections 21, 22, and 23 of first sensing time 20 of FIG. 12. In first section 51, at least one of a first voltage level V1 applied to the selected word line and a length of first section 51 may be determined according to the first program verification voltage level V_T1. The second verification time VFY2 may be divided into a first section 54 and a second section 55, which may respectively correspond to first and second sections 31 and 32 of second sensing time 30 of FIG. 12.

Figure 14:
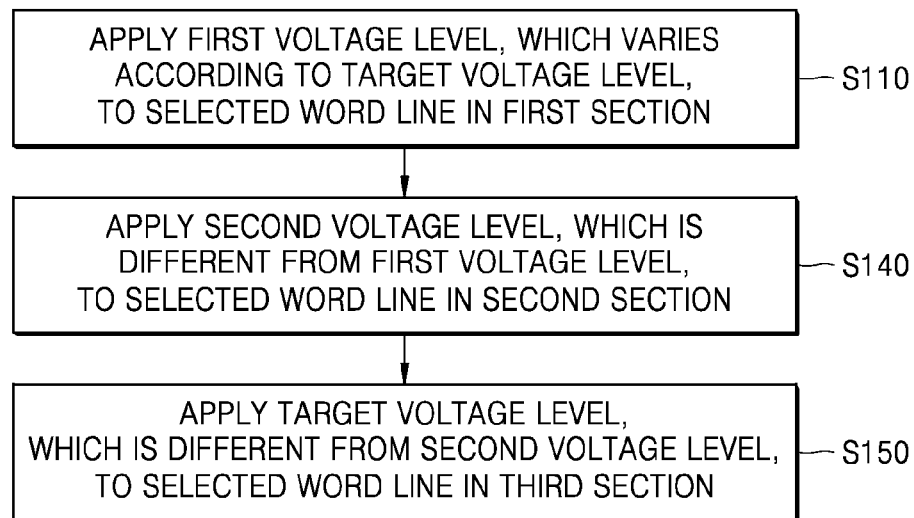
FIGS. 14, 15, 16 and 17 are flowcharts of methods of operating non-volatile memory devices, according to embodiments.

FIG. 14 is a flowchart of a method of operating a non-volatile memory device, according to an embodiment.

Referring to FIG. 13, the method of operating the non-volatile memory device, according to the present embodiment, may correspond to a method of driving a selected word line when a sensing operation is performed on the non-volatile memory device. The method of operating the non-volatile memory device according to the present embodiment may be, for example, sequentially performed in non-volatile memory device 100 of FIG. 1. The above descriptions presented with reference to FIGS. 1 to 13 may be applied to the present embodiment, and repeated descriptions thereof will be omitted.

In operation S110, in a first section, a first voltage level, which is variable according to a target voltage level, may be applied to the selected word line. In operation S110, a high voltage, such as a pass voltage, may be applied to an adjacent word line adjacent to the selected word line. When the first voltage level is applied to the selected word line, coupling noise due to the adjacent word line may be inhibited. For example, as the target voltage level becomes greater, the first voltage level may become greater. For example, the target voltage level may be a positive voltage. For example, the target voltage level may be greater than or equal to a critical voltage level. For example, the target voltage level may be a negative voltage. In this case, the first voltage level may increase with a magnitude of the target voltage level.

In operation S140, in a second section, a second voltage level that is different from the first voltage level may be applied to the selected word line. By applying the second voltage level to the selected word line while the first voltage level is being applied to the selected word line, the selected word line may be stably overdriven. In operation S150, in a third section, the target voltage level that is different from the second voltage level may be applied to the selected word line. Memory cells may be sensed depending on whether memory cells connected to the selected word line to which the target voltage level is applied are turned on or off.

Figure 15:
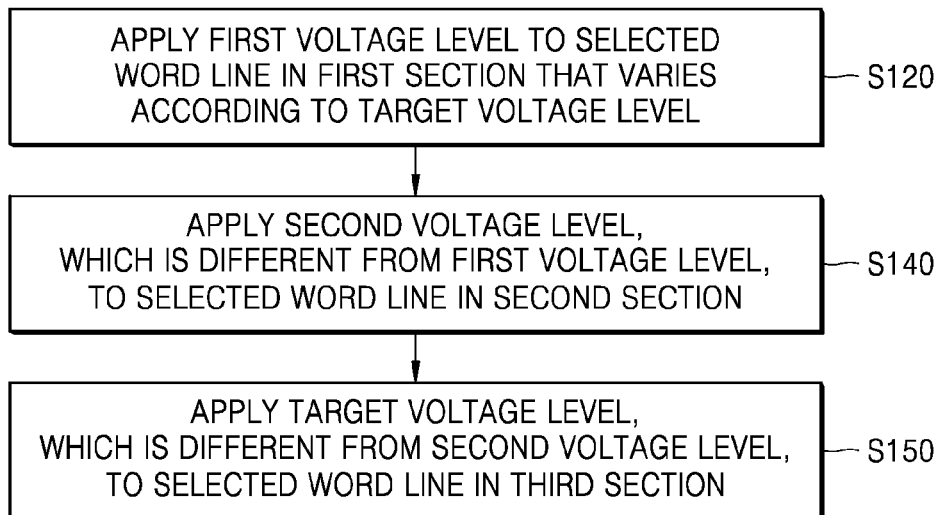

FIG. 15 is a flowchart of a method of operating a non-volatile memory device, according to an embodiment.

Referring to FIG. 15, the method of operating the non-volatile memory device, according to the present embodiment, may correspond to a method of driving a selected word line when a sensing operation is performed on the non-volatile memory device, and correspond to a modified example of the method shown in FIG. 14. The above descriptions presented with reference to FIGS. 1 to 14 may be applied to the present embodiment, and repeated descriptions thereof will be omitted.

In operation S120, in a first section that is variable according to a target voltage level, a first voltage level may be applied to the selected word line. For example, as the target voltage level becomes greater, a duration of the first section may become longer. For example, the target voltage level may be a positive voltage. For example, the target voltage level may be greater than or equal to a critical voltage level. For example, the target voltage level may be a negative voltage. In this case, the first section may increase with a magnitude of the target voltage level. In operation S140, in a second section, a second voltage level that is different from the first voltage level may be applied to the selected word line. In operation S150, in a third section, the target voltage level that is different from the second voltage level may be applied to the selected word line.

Figure 16:
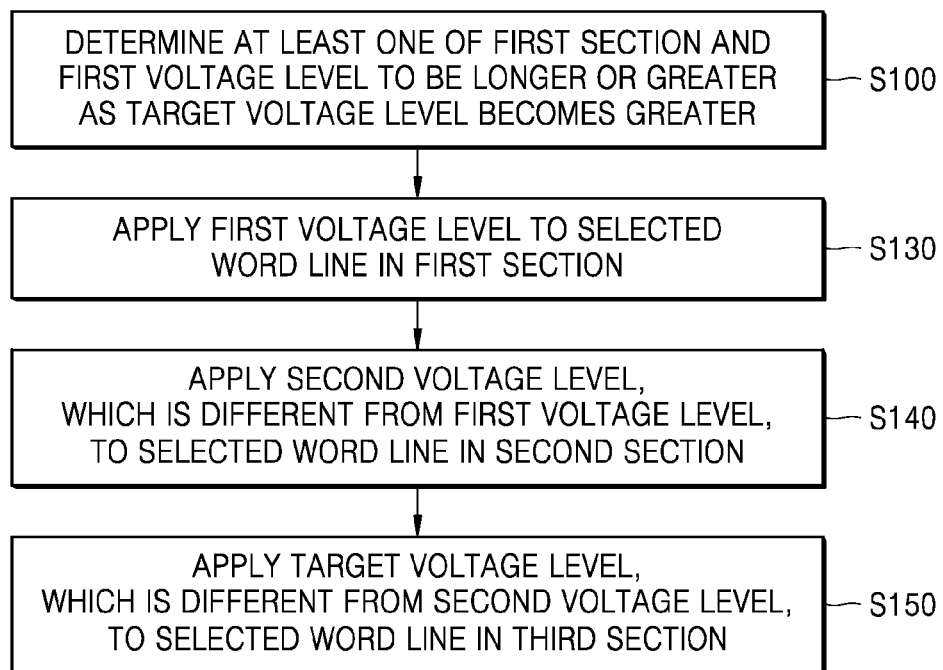

FIG. 16 is a flowchart of a method of operating a non-volatile memory device, according to an embodiment.

Referring to FIG. 16, the method of operating the non-volatile memory device, according to the present embodiment, may correspond to a method of driving a selected word line when a sensing operation is performed on the non-volatile memory device, and correspond to a modified example of the method shown in FIG. 13 or FIG. 14. The above descriptions presented with reference to FIGS. 1 to 15 may be applied to the present embodiment, and repeated descriptions thereof will be omitted.

In operation S100, as a target voltage level becomes greater, at least one of a duration of the first section and a first voltage level may be determined to be longer or greater. In operation S130, in the first section, the first voltage level may be applied to the selected word line. In operation S140, in a second section, a second voltage level that is different from the first voltage level may be applied to the selected word line. In operation S150, in a third section, the target voltage level that is different from the second voltage level may be applied to the selected word line.

Figure 17:
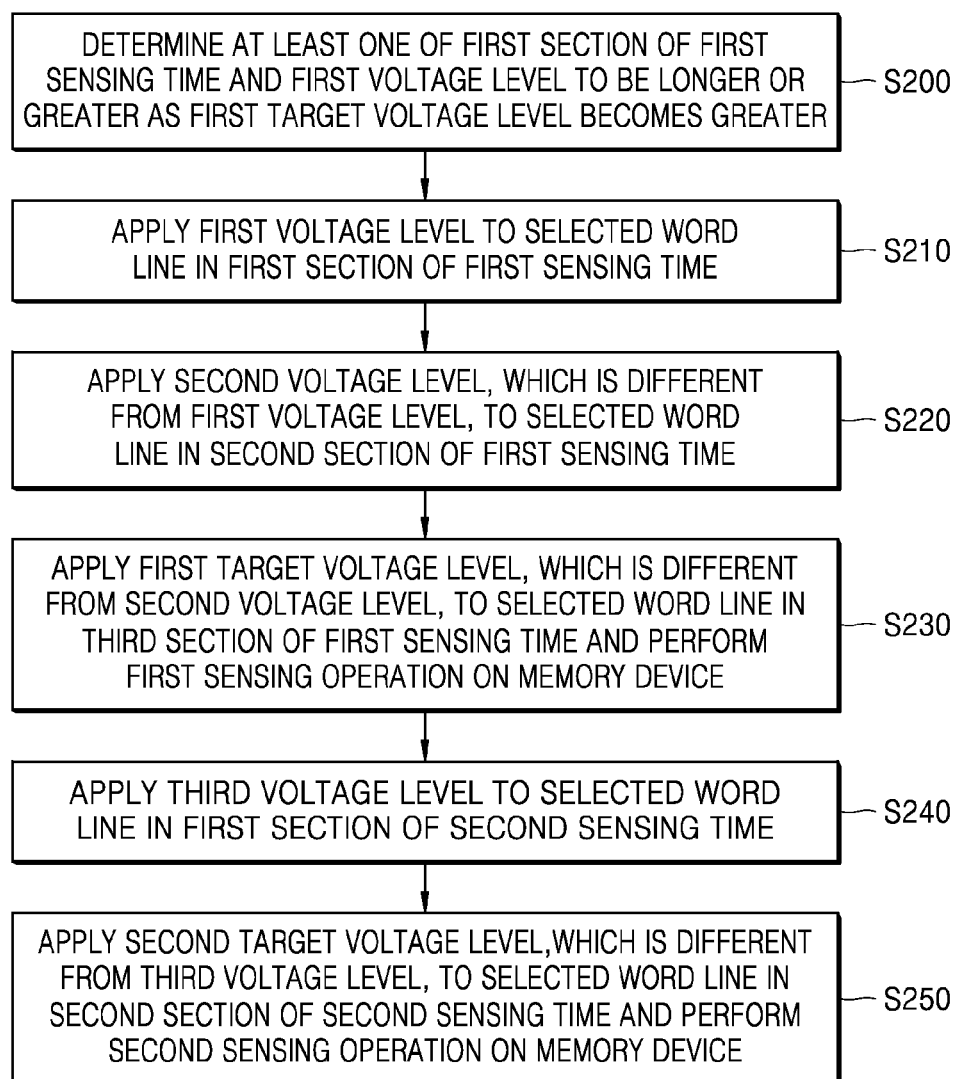

FIG. 17 is a flowchart of a method of operating a non-volatile memory device, according to an embodiment.

Referring to FIG. 17, the method of operating the non-volatile memory device, according to the present embodiment, may correspond to a method of driving a selected word line when a plurality of sensing operations are performed on the non-volatile memory device, and correspond to a modified example of the methods shown in FIGS. 14 to 16. The above descriptions presented with reference to FIGS. 1 to 16 may be applied to the present embodiment, and repeated descriptions thereof will be omitted.

In operation S200, as a first target voltage level becomes greater, at least one of a duration of the first section of a first sensing time and a first voltage level may be determined to be longer or greater. In operation S210, in the first section of the first sensing time, the first voltage level may be applied to the selected word line. In operation S220, in a second section of the first sensing time, a second voltage level that is different from the first voltage level may be applied to the selected word line. In operation S230, in a third section of the first sensing time, the first target voltage level that is different from the second voltage level may be applied to the selected word line so that a first sensing operation may be performed on the non-volatile memory device.

In operation S240, in a first section of a second sensing time, a third voltage level may be applied to the selected word line. In operation S250, in a second section of the second sensing time, a second target voltage level that is different from the third voltage level may be applied to the selected word line so that a second sensing operation may be performed on the non-volatile memory device. When a third sensing operation is performed after the second sensing time, a voltage of the selected word line may be controlled in two stages as shown in operations S240 and S250.

Figure 18:
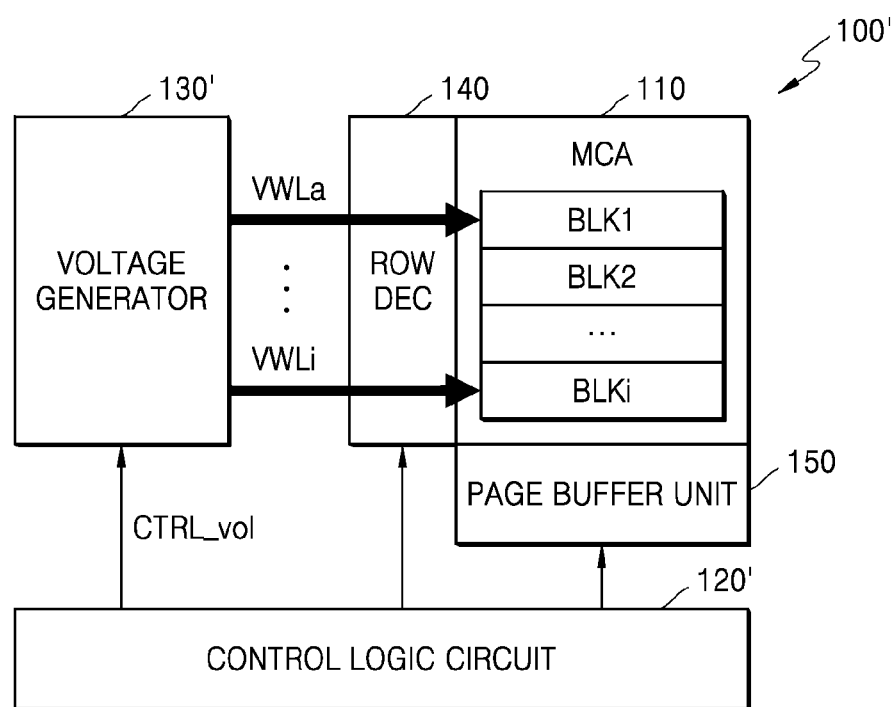
FIGS. 18 and 19 are block diagrams of embodiments of non-volatile memory devices.

FIG. 18 is a block diagram of an embodiment of a non-volatile memory device 100'.

Referring to FIG. 18, non-volatile memory device 100' may include a memory cell array 110, a control logic circuit 120', a voltage generator 130', a row decoder 140, and a page buffer unit 150. Non-volatile memory device 100' according to the present embodiment may correspond to a modified example of non-volatile memory device 100 shown in FIG. 1. The above descriptions presented with reference to FIGS. 1 to 17 may be applied to the present embodiment.

Memory cell array 110 may include a plurality of memory blocks BLK1 to BLKi, and distances between the plurality of memory blocks BLK1 to BLKi and voltage generator 130' may be different from each other. For instance, a distance between the first memory block BLK1 and voltage generator 130' may be shorter than a distance between the i-th memory block BLKi and voltage generator 130'. Thus, a loading time of word lines may be shorter during a sensing operation on the first memory block BLK1 than during a sensing operation on the i-th memory block BLKi.

Referring to FIGS. 5 and 18, during a sensing operation on memory cell array 110, control logic circuit 120' may determine at least one of a first voltage level V1 applied to the selected word line and a first control time T1 in a first section 21 of a sensing time 20, based on a position of a memory block or the number of memory blocks driven at the same time, along with a target voltage level V_T applied to a selected word line.

For instance, when a first sensing operation is performed on the first memory block BLK1, control logic circuit 120' may divide a first sensing time for which the first sensing operation is performed, into first to third sections and control a first selected word line voltage VWLa in three stages. For example, when a second sensing operation is performed on the i-th memory block BLKi, control logic circuit 120' may divide a second sensing time for which the second sensing operation is performed, into first to third sections and control an i-th selected word line voltage VWLi in three stages.

For example, when a target voltage level V_T applied to the selected word line in the first sensing operation is equal to a target voltage level V_T applied to the selected word line in the second sensing operation, a voltage level of the first selected word line voltage VWLa in the first section may be less than a voltage level of the i-th selected word line voltage VWLi in the first section. Also, a control time for which the first selected word line voltage VWLa is applied in the first section may be shorter than a control time for which the i-th selected word line voltage VWLi is applied in the first section.

In an embodiment, during the sensing operation on memory cell array 110, control logic circuit 120' may differently determine the first voltage level V1 applied to the selected word line or the first control time T1 in first section 21 of sensing time 20, based on a factor (e.g., a threshold voltage of a selected memory cell), which may affect the loading of a word line, along with the target voltage level V_T applied to the selected word line. For example, as the threshold voltage of the selected memory cell is reduced, a capacitance of the selected memory cell may increase. Thus, when the target voltage level V_T is the same, as the threshold voltage of the selected memory cell is reduced, the first voltage level V1 applied to the selected word line and/or a duration of the first control time T1 may be determined to be greater or longer in first section 21 of sensing time 20.

In an embodiment, during the sensing operation on memory cell array 110, control logic circuit 120' may differently determine the first voltage level V1 applied to the selected word line or the first control time T1 in first section 21 of sensing time 20, based on factors capable of affecting the loading of the word line along with the target voltage level V_T applied to the selected word line. The factors capable of affecting the loading of the word line may include, for example, a threshold voltage of a memory cell adjacent to the selected memory cell. In an embodiment, during the sensing operation on memory cell array 110, control logic circuit 120' may differently determine the first voltage level V1 applied to the selected word line or the first control time T1 in first section 21 of sensing time 20, based on factors capable of affecting the loading of the word line along with the target voltage level V_T applied to the selected word line. The factors capable of affecting the loading of the word line may include, for example, a temperature, a count of cycles of program/erase operations, and a kind (SLC or MLC) of memory cells.

As described above, when the voltage of the selected word line is controlled in three stages during the sensing operation, the first voltage level V1 applied to the selected word line in first section 21 and a length of first section 21 may be determined based on a factor capable of affecting the loading of the word line and the target voltage level V_T. The factor capable of affecting the loading of the word line may include at least one of positions and number of selected word lines, positions and number of memory blocks positions and number of memory planes, positions and number of memory chips, the number of data bits written to a memory cell, temperature information, a count of cycles of program/erase operations, the number of program loops, a threshold voltage of the selected memory cell, a threshold voltage of an adjacent memory cell, and an operation mode.

Figure 19:
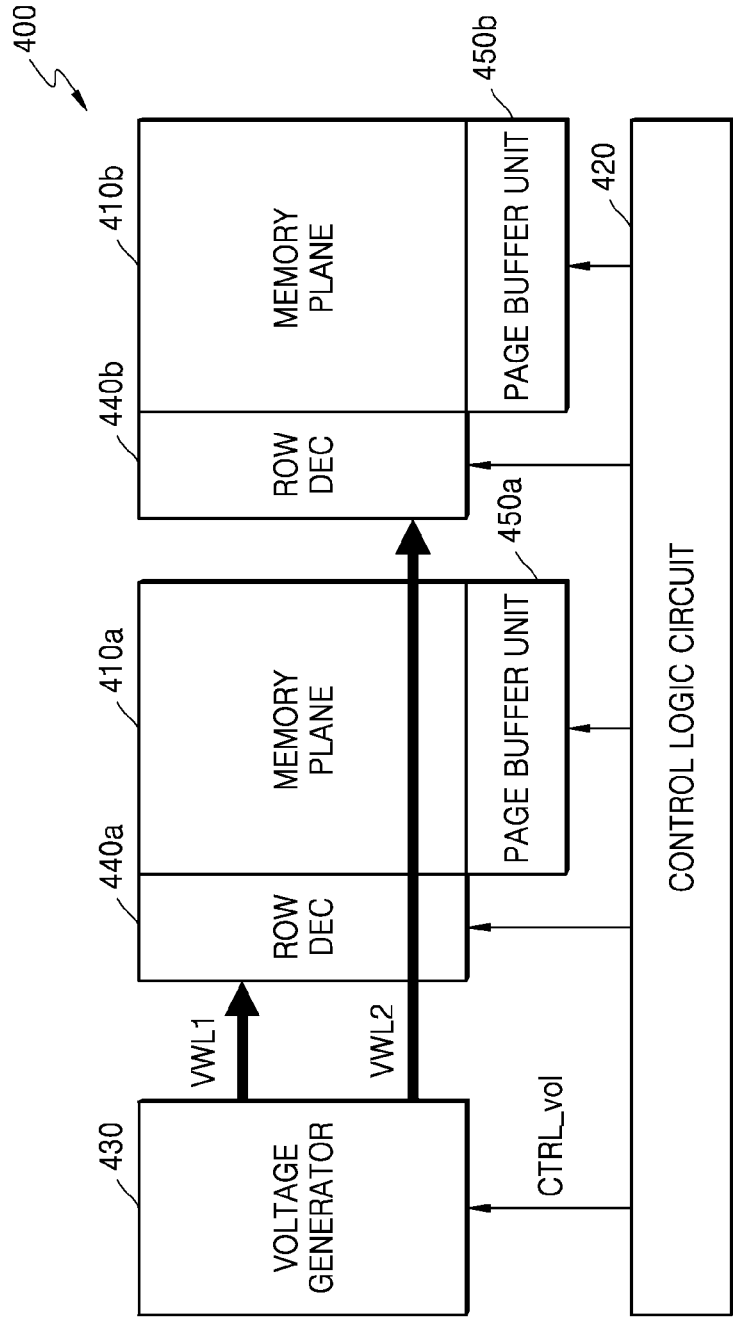

FIG. 19 is a block diagram of an embodiment of a non-volatile memory device 400.

Referring to FIG. 19, non-volatile memory device 400 may include first and second memory planes 410*a* and 410*b*, a control logic circuit 420, a voltage generator 430, first and second row decoders 440*a* and 440*b*, and first and second page buffer units 450*a* and 450*b*. However, embodiments are not limited thereto, and non-volatile memory device 400 may include a first control logic circuit configured to control first memory plane 410*a* and a second control logic circuit configured to control second memory plane 410*b* instead of control logic circuit 420. Non-volatile memory device 400 according to the present embodiment may correspond to a modified example of non-volatile memory device 100 shown in FIG. 1 or non-volatile memory device 100' shown in FIG. 18. The same descriptions as with reference to FIGS. 1 to 18 may be applied to the present embodiment.

A distance between first memory plane 410*a* and voltage generator 430 may be different from a distance between second memory plane 410*b* and voltage generator 430. For example, the distance between first memory plane 410*a* and voltage generator 430 may be shorter than the distance between second memory plane 410*b* and voltage generator 430. Thus, a loading time of word lines may be shorter during a sensing operation on first memory plane 410*a* than during a sensing operation on second memory plane 410*b*.

Referring to FIGS. 5 and 19, during the sensing operation on first memory plane 410*a*, control logic circuit 420 may determine at least one of a voltage level and an application time of a first selected word line voltage VWL1 in first section 21 of sensing time 20, based on a target voltage level V_T applied to a selected word line. Also, during the sensing operation on second memory plane 410*b*, control logic circuit 420 may determine at least one of a voltage level and an application time of a second selected word line voltage VWL2 in first section 21 of sensing time 20, based on the target voltage level V_T applied to the selected word line.

For example, when a first sensing operation is performed on first memory plane 410*a*, control logic circuit 420 may divide a first sensing time for performing the first sensing operation into first to third sections and control the first selected word line voltage VWL1 in three stages. For example, when a second sensing operation is performed on second memory plane 410*b*, control logic circuit 420 may divide a second sensing time for performing the second sensing operation into first to third sections and control the second selected word line voltage VWL2 in three stages.

For example, when a target voltage level V_T applied to the selected word line during the first sensing operation is equal to a target voltage level V_T applied to the selected word line during the second sensing operation, a voltage level of the first selected word line voltage VWL1 in the first section may be less than a voltage level of the second selected word line voltage VWL2 in the first section. Also, a control time for which the first selected word line voltage VWL1 is applied in the first section may be shorter than a control time for which the second selected word line voltage VWL2 is applied in the first section.

Figure 20:
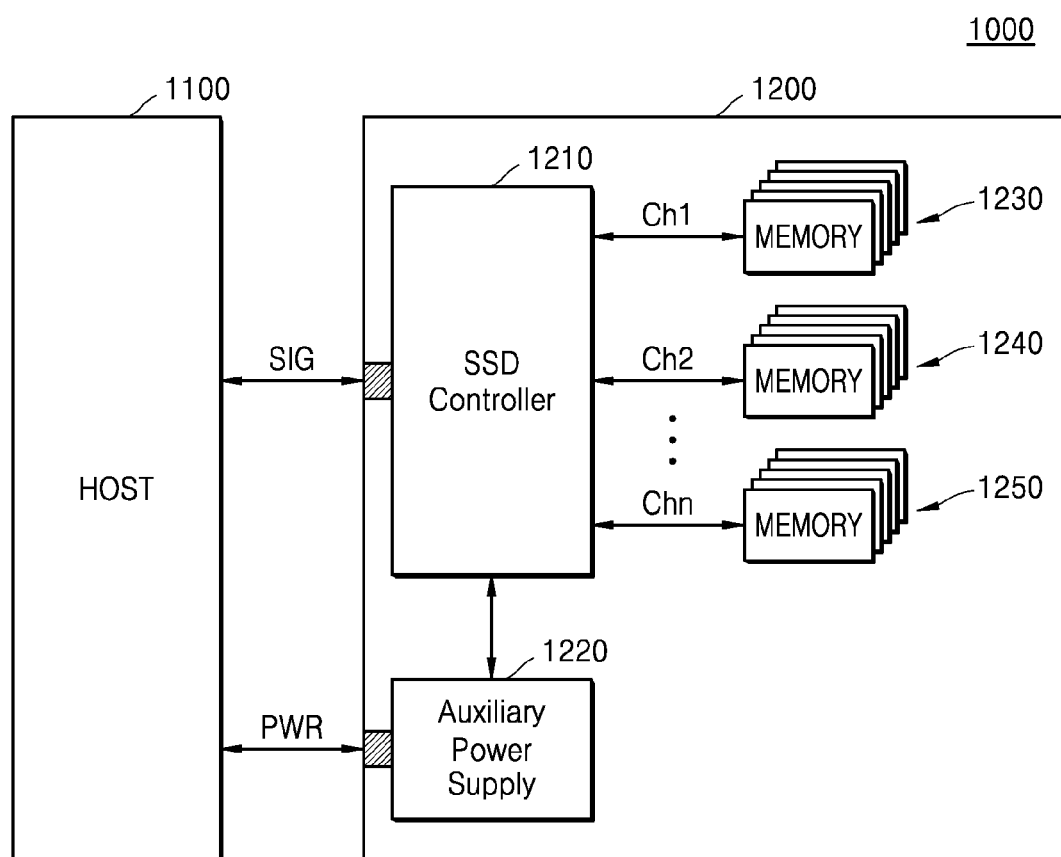
FIG. 20 is a block diagram of an example of applying an embodiment of a memory device to a solid-state drive (SSD) system.

FIG. 20 is a block diagram of an example of applying a memory device according to an embodiment to a solid-state drive (SSD) system 1000.

Referring to FIG. 20, SSD system 1000 may include a host 1100 and an SSD 1200. SSD 1200 may transmit and receive signals to and from host 1100 through a signal connector and receive power through a power connector. SSD 1200 may include an SSD controller 1210, an auxiliary power supply 1220, and memory devices 1230, 1240, and 1250. Memory devices 1230, 1240, and 1250 may be vertical-stack-type NAND flash memory devices. In this case, SSD 1200 may be implemented using the embodiments described above with reference to FIGS. 1 to 19.

Figure 21:
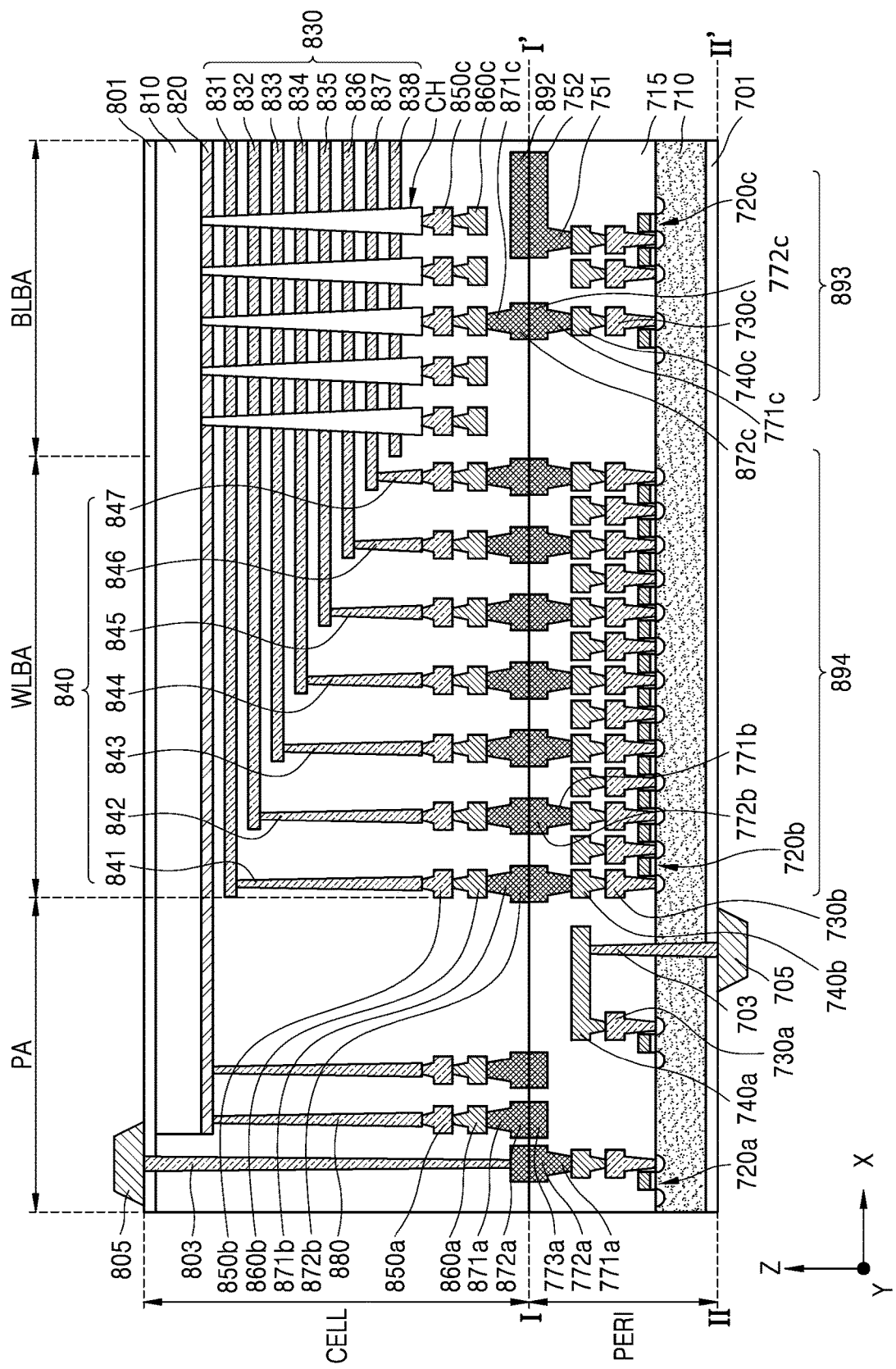
FIG. 21 illustrates a memory device having a chip-to-chip structure, according to embodiments.

FIG. 21 illustrates a memory device 900 having a chip-to-chip structure, according to embodiments.

Referring to FIG. 21, a memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740a, 740b, and 740c may be formed of copper having relatively low resistance.

In an example embodiment illustrate in FIG. 21, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to c in a bonding manner, and the lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 21, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially, and first metal layer 860a may be connected to upper bonding metal 871a. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 21, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 21, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803 and lower bonding metals 772a and 771a.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 21, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a, corresponding to an upper metal pattern 872a formed in an uppermost metal layer of the cell region CELL, and having the same shape as the upper metal pattern 872a of the cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding.

Further, the bit line bonding area BLBA, an upper metal pattern 892, corresponding to a lower metal pattern 752 formed in the uppermost metal layer of the peripheral circuit region PERI, and having the same shape as the lower metal pattern 752 of 752 of the peripheral circuit region PERI, may be formed in an uppermost metal layer of the cell region CELL. A contact may not be formed on the upper metal pattern 892 formed in the uppermost metal layer of the cell region CELL. Lower metal pattern 752 may be connected to circuit elements 720c by lower bonding metal 751.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Typical example embodiments of the inventive concept are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the inventive concept as defined by the following claims.

What is claimed is:

1. A method of operating a non-volatile memory device, the method comprising:
    performing a first sensing operation on the non-volatile memory device during a first sensing time, the first sensing time including a first section, a second section following the first section, and a third section following the second section; and
    performing a second sensing operation on the non-volatile memory device during a second sensing time, the second sensing time including a fourth section following the third section, and a fifth section following the fourth section,
    wherein the performing of the first sensing operation comprises:
        applying a first voltage level to a selected word line during the first section,
        applying a second voltage level to the selected word line during the second section, wherein the second voltage level is different from the first voltage level, and
        applying a first target voltage level to the selected word line during the third section, wherein the first target voltage level is different from the second voltage level,
    wherein the performing of the second sensing operation comprises:
        applying a third voltage level to the selected word line during the fourth section, and
        applying a second target voltage level to the selected word line during the fifth section, wherein the second target voltage level is different from the third voltage level,
    wherein the first voltage level is different from the third voltage level, and
    wherein the first and second sections correspond to a word line setup time required to perform the first sensing operation, and the fourth section corresponds to a word line setup time required to perform the second sensing operation.

2. The method of claim 1, wherein the first voltage level becomes greater as the first target voltage level becomes greater, and
    the third voltage level becomes greater as the second target voltage level becomes greater.

3. The method of claim 1, wherein the first target voltage level corresponds to a voltage level for sensing a first threshold voltage distribution among a plurality of threshold voltage distributions of memory cells, and
    the second target voltage level corresponds to a voltage level for sensing a second threshold voltage distribution among the plurality of threshold voltage distributions of memory cells.

4. The method of claim 1, wherein each of the first and second sensing operations corresponds to one of a read operation, a program verification operation, and an erase verification operation,
wherein each of the first and second target voltage levels corresponds to one of a read voltage, a program verification voltage, and an erase verification voltage according to an operation mode of the non-volatile memory device.

5. The method of claim 1, wherein the first section is shorter than a voltage rise time of an adjacent word line from among a plurality of word lines that is adjacent to the selected word line.

6. The method of claim 5, wherein the performing of the first sensing operation further comprises applying a pass voltage to the adjacent word line after the voltage rise time of the adjacent word line.

7. The method of claim 1, further comprising:
before the applying of the first voltage level to the selected word line, determining the first voltage level, based on one or more factors capable of affecting loading of word lines and the first target voltage level,
wherein the factors include at least one of positions and number of selected word lines from among a plurality of word lines, positions and number of memory blocks of the non-volatile memory device including the selected word lines, positions and number of memory planes of the non-volatile memory device including the selected word lines, positions and number of memory chips of the non-volatile memory device including the selected word lines, a number of data bits written to a selected memory cell connected to the selected word line, temperature information, a count of cycles of program/erase operations on the selected memory cell, a number of program loops, a threshold voltage of the selected memory cell, a threshold voltage of an adjacent memory cell of the non-volatile memory device that is adjacent to the selected memory cell, and an operation mode of the non-volatile memory device.

8. The method of claim 1, wherein the first target voltage level is a positive voltage.

9. The method of claim 1, wherein the first target voltage level is greater than the second target voltage level.

10. A method of operating a non-volatile memory device, the method comprising:
performing a first sensing operation on the non-volatile memory device during a first sensing time, the first sensing time including a first section, a second section following the first section, and a third section following the second section; and
performing a second sensing operation on the non-volatile memory device during a second sensing time, the second sensing time including a fourth section following the third section, a fifth section following the fourth section, and a sixth section following the fifth section,
wherein the performing of the first sensing operation comprises:
applying a first voltage level to a selected word line during the first section,
applying a second voltage level to the selected word line during the second section, wherein the second voltage level is different from the first voltage level, and
applying a first target voltage level to the selected word line during the third section, wherein the first target voltage level is different from the second voltage level,
wherein the performing of the second sensing operation comprises:
applying a third voltage level to the selected word line during the fourth section,
applying a fourth voltage level to the selected word line during the fifth section, and
applying a second target voltage level to the selected word line during the sixth section, wherein the second target voltage level is different from the fourth voltage level,
wherein a duration of the first section is different from a duration of the fourth section, and
wherein the first and second sections correspond to a word line setup time required to perform the first sensing operation, and the fourth and fifth sections correspond to a word line setup time required to perform the second sensing operation.

11. The method of claim 10, wherein the duration of the first section becomes longer as the first target voltage level becomes greater, and
the duration of the fourth section becomes longer as the second target voltage level becomes greater.

12. The method of claim 10, wherein the first sensing time corresponds to a time for reading a first threshold voltage distribution among a plurality of threshold voltage distributions of memory cells, and the second sensing time corresponds to a time for reading a second threshold voltage distribution among the plurality of threshold voltage distributions.

13. The method of claim 10, wherein each of the first and second sensing operations corresponds to one of a read operation, a program verification operation, and an erase verification operation,
wherein each of the first and second target voltage levels corresponds to one of a read voltage, a program verification voltage, and an erase verification voltage according to an operation mode of the non-volatile memory device.

14. The method of claim 10, wherein the first section is shorter than a voltage rise time of an adjacent word line from among a plurality of word lines that is adjacent to the selected word line.

15. The method of claim 14, wherein the performing of the first sensing operation further comprises applying a pass voltage to the adjacent word line after the voltage rise time of the adjacent word line.

16. The method of claim 10, further comprising:
before the applying of the first voltage level to the selected word line, determining the duration of the first section, based on one or more factors capable of affecting loading of word lines and the first target voltage level,
wherein the factors include at least one of positions and number of selected word lines from among a plurality of word lines, positions and number of memory blocks of the non-volatile memory device including the selected word lines, positions and number of memory planes of the non-volatile memory device including the selected word lines, positions and number of memory chips of the non-volatile memory device including the selected word lines, a number of data bits written to a selected memory cell connected to the selected word line, temperature information, a count of cycles of program/erase operations on the selected memory cell, a number of program loops, a threshold voltage of the selected memory cell, a threshold voltage of an adjacent memory cell of the non-volatile memory device that is adjacent to the selected memory cell, and an operation mode of the non-volatile memory device.

17. The method of claim 10, wherein the first target voltage level is a positive voltage.

18. The method of claim 10, wherein the first target voltage level is greater than the second target voltage level.

19. A method of operating a non-volatile memory device, the method comprising:
- performing a first sensing operation on the non-volatile memory device during a first sensing time, the first sensing time including a first section, a second section following the first section, and a third section following the second section; and
- performing a second sensing operation on the non-volatile memory device during a second sensing time, the second sensing time including a fourth section following the third section, a fifth section following the fourth section, and a sixth section following the fifth section,
- wherein the performing of the first sensing operation comprises:
  - applying a first voltage level to a selected word line during the first section,
  - applying a second voltage level to the selected word line during the second section, wherein the second voltage level is different from the first voltage level, and
  - applying a first target voltage level to the selected word line during the third section, wherein the first target voltage level is different from the second voltage level,
- wherein the performing of the second sensing operation comprises:
  - applying a third voltage level to the selected word line during the fourth section,
  - applying a fourth voltage level to the selected word line during the fifth section, and
  - applying a second target voltage level to the selected word line during the sixth section, wherein the second target voltage level is different from the fourth voltage level,
- wherein the first target voltage level is different from the second target voltage level, and
- wherein the first voltage level is different from the third voltage level or a duration of the first section is different from a duration of the fourth section,
- wherein the first and second sections correspond to a word line setup time required to perform the first sensing operation, and the fourth and fifth sections correspond to a word line setup time required to perform the second sensing operation.

20. The method of claim 19, wherein the first target voltage level is greater than the second target voltage level.

* * * * *

UNITED STATES PATENT AND TRADEMARK OFFICE
CERTIFICATE OF CORRECTION

| | | |
|---|---|---|
| PATENT NO. | : 11,594,286 B2 | Page 1 of 1 |
| APPLICATION NO. | : 17/665049 | |
| DATED | : February 28, 2023 | |
| INVENTOR(S) | : Dong-Hun Kwak | |

It is certified that error appears in the above-identified patent and that said Letters Patent is hereby corrected as shown below:

On the Title Page

In Column 1, after item (63), insert:
-- (30) Foreign Application Priority Data
Dec. 12, 2018 (KR) . . . . . . . . . . . . . 10-2018-0160352 --, therefor.

Signed and Sealed this
Thirtieth Day of April, 2024

Katherine Kelly Vidal
*Director of the United States Patent and Trademark Office*